(12) United States Patent
Sakuma et al.

(10) Patent No.: US 10,438,801 B2
(45) Date of Patent: Oct. 8, 2019

(54) SEMICONDUCTOR MEMORY DEVICE

(71) Applicant: TOSHIBA MEMORY CORPORATION, Minato-ku (JP)

(72) Inventors: Kiwamu Sakuma, Yokkaichi (JP); Masumi Saitoh, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/916,690

(22) Filed: Mar. 9, 2018

(65) Prior Publication Data

US 2019/0096683 A1    Mar. 28, 2019

(30) Foreign Application Priority Data

Sep. 22, 2017    (JP) ................. 2017-182103

(51) Int. Cl.
*H01L 29/10*    (2006.01)
*H01L 29/423*    (2006.01)
*H01L 29/04*    (2006.01)
*H01L 29/788*    (2006.01)
*H01L 27/115*    (2017.01)
(Continued)

(52) U.S. Cl.
CPC .... *H01L 21/28273* (2013.01); *H01L 21/0262* (2013.01); *H01L 27/11521* (2013.01); *H01L 27/11546* (2013.01); *H01L 27/1211* (2013.01); *H01L 27/1281* (2013.01); *H01L 29/66757* (2013.01)

(58) Field of Classification Search
CPC ......... H01L 21/28273; H01L 27/11521; H01L 27/11546; H01L 27/1211; H01L 27/1281; H01L 29/66757; H01L 21/0262
See application file for complete search history.

(56) References Cited

U.S. PATENT DOCUMENTS 7,936,004 B2    5/2011    Kito et al.
8,008,732 B2    8/2011    Kiyotoshi et al.
(Continued)

FOREIGN PATENT DOCUMENTS

JP    2007-266143    10/2007
JP    2008-072093    3/2008
(Continued)

*Primary Examiner* — Brian Turner
(74) *Attorney, Agent, or Firm* — Oblon, McClelland, Maier & Neustadt, L.L.P.

(57) ABSTRACT

A semiconductor memory device including a first semiconductor layer, first gate electrodes, a first gate insulating layer and a laminated film. The first semiconductor layer extends in a first direction intersecting a substrate. The first gate electrodes are arranged in the first direction and face the first semiconductor layer in a second direction intersecting the first direction. End portions of the first gate electrodes in the second direction have different positions from each other and form a stepped contact portion. The laminated film covers at least parts of upper surfaces and at least parts of side surfaces intersecting the second direction, of the first gate electrodes. The laminated film includes a first insulating layer, second semiconductor layers, a second gate insulating layer, and a second gate electrode. Positions in the first direction and positions in the second direction of the second semiconductor layers are different from each other.

13 Claims, 34 Drawing Sheets

(51) Int. Cl.
    *H01L 21/28* (2006.01)
    *H01L 27/11521* (2017.01)
    *H01L 27/11546* (2017.01)
    *H01L 21/02* (2006.01)
    *H01L 27/12* (2006.01)
    *H01L 29/66* (2006.01)

(56) References Cited

U.S. PATENT DOCUMENTS

| | | | |
|---|---|---|---|
| 8,786,003 | B2 | 7/2014 | Iwase et al. |
| 9,203,023 | B2 | 12/2015 | Saitoh et al. |
| 9,548,085 | B2 | 1/2017 | Saitoh |
| 9,614,103 | B2 | 4/2017 | Ota et al. |
| 9,786,683 | B1 | 10/2017 | Sakuma et al. |
| 2010/0320526 | A1* | 12/2010 | Kidoh ............... H01L 23/522 257/324 |
| 2011/0284946 | A1 | 11/2011 | Kiyotoshi |
| 2015/0069496 | A1 | 3/2015 | Shiga |
| 2015/0262871 | A1* | 9/2015 | Lee ............... H01L 21/76816 257/774 |
| 2016/0268304 | A1 | 9/2016 | Ikeda et al. |
| 2017/0077230 | A1 | 3/2017 | Ikeda et al. |

FOREIGN PATENT DOCUMENTS

| | | |
|---|---|---|
| JP | 2008-078404 | 4/2008 |
| JP | 2009-238874 | 10/2009 |
| JP | 2013-055142 | 3/2013 |
| JP | 2015-056434 | 3/2015 |
| JP | 2015-159260 | 9/2015 |
| JP | 2016-100387 | 5/2016 |
| JP | 2016-134578 | 7/2016 |
| JP | 2016-171243 | 9/2016 |
| JP | 2017-059607 | 3/2017 |
| JP | 2017-168759 | 9/2017 |

* cited by examiner

SEMICONDUCTOR MEMORY DEVICE

CROSS-REFERENCE TO RELATED APPLICATIONS

This application is based upon and claims the benefit of Japanese Patent Application No. 2017-182103, filed on Sep. 22, 2017, the entire contents of which are incorporated herein by reference.

BACKGROUND

Field

Embodiments described herein relate to a semiconductor memory device.

Description of the Related Art

Along with high integration of a semiconductor memory device, development of a semiconductor memory device in which memory cells are disposed three-dimensionally proceeds. As such a semiconductor memory device, so-called flash memory in which a field effect transistor having a gate insulating layer capable of charge storage is used as a memory cell, so-called ReRAM in which a resistance change element which reversibly changes resistance is utilized as a memory cell, or the like are known. The semiconductor memory device using the flash memory includes a first semiconductor layer extending in a first direction intersecting an upper surface of a substrate, a plurality of first gate electrodes arranged in the first direction and facing the first semiconductor layer in a second direction intersecting the first direction, and a first gate insulating layer provided between the first semiconductor layer and the first gate electrodes and including a charge storage layer.

In such a semiconductor memory device, the positions of the end portions of the first gate electrodes in the second direction are made different in order to connect contact electrodes to the plurality of the first gate electrodes. These end portions of the first gate electrodes form a stepped contact portion.

It is desired to reduce an area of a peripheral circuit in order to achieve further high integration of the semiconductor memory device.

DETAILED DESCRIPTION

Figure 1:
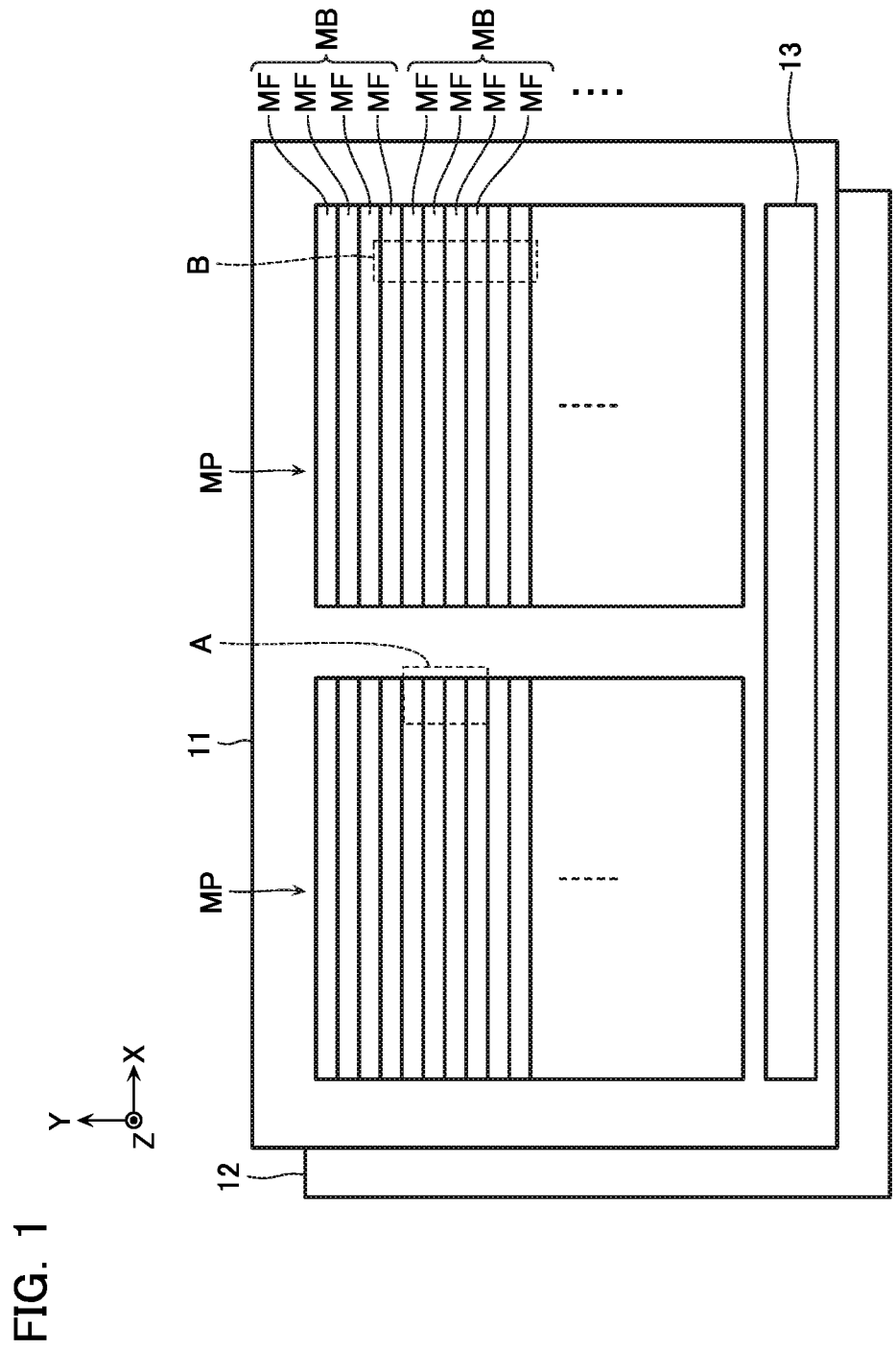
FIG. 1 is a schematic plan view showing a semiconductor memory device according to a first embodiment.

A semiconductor memory device according to one embodiment of the present invention includes a first semiconductor layer, a plurality of first gate electrodes, a first gate insulating layer, and a laminated film. The first semiconductor layer is provided above a substrate and extends in a first direction intersecting an upper surface of the substrate. A plurality of first gate electrodes are arranged in the first direction, extend in a second direction intersecting the first direction, face the first semiconductor layer in the second direction, and have end portions in the second direction, positions of the end portions in the second direction being different from each other to form a stepped contact portion. The first gate insulating layer is provided between the first semiconductor layer and the first gate electrodes and includes a memory portion. The laminated film covers at least parts of upper surfaces of the first gate electrodes and at least parts of side surfaces intersecting the second direction of the first gate electrodes. Moreover, the laminated film includes a first insulating layer laminated on the contact portion, a plurality of second semiconductor layers provided on the first insulating layer, a second gate insulating layer provided on the plurality of the second semiconductor layers, and a second gate electrode provided on the second gate insulating layer. Positions of the plurality of the second semiconductor layers in the first direction are different from each other. Additionally, positions of the plurality of the second semiconductor layers in the second direction are different from each other.

Next, semiconductor memory devices according to embodiments will be described in detail with reference to the drawings. Note that these embodiments are merely examples, and are not shown with the intention of limiting the present invention.

Moreover, in the description below, a main surface of the substrate will be called an upper surface, a direction intersecting the upper surface of the substrate will be called a first direction, a direction intersecting the first direction will be called a second direction, and a direction intersecting the first direction and the second direction will be called a third direction. In addition, a direction moving away from the substrate along the first direction will be called upward, and a direction moving towards the substrate along the first direction will be called downward. Moreover, when an upper surface is referred to for a certain configuration, this is assumed to mean a surface opposite from the substrate, and when a lower surface is referred to for a certain configuration, this is assumed to mean a surface facing the substrate. In addition, a surface intersecting the second direction and the third direction will be called a side surface. In addition, a certain direction parallel to the upper surface of the substrate will be called an X direction, a direction parallel to the upper surface of the substrate and perpendicular to the X direction will be called a Y direction, and a direction perpendicular to the upper surface of the substrate will be called a Z direction. Note that, although the description below exemplifies the case where the first direction corresponds with the Z direction, the second direction corresponds with the X direction, and the third direction corresponds with the Y direction, the first, second, and third directions need not correspond with the Z direction, the X direction, and the Y direction.

Moreover, note that in the specification, "memory cell" means elements capable of storing data of at least 1 bit, such as a field effect transistor capable of storing charge in a gate insulating layer, a resistance change element capable of changing resistance reversibly, the resistance change element having a rectification property, or the like.

First Embodiment

[Configuration]

FIG. 1 is a schematic plan view showing a semiconductor memory device according to a first embodiment.

The semiconductor memory device according to the first embodiment includes a memory die 11 and a control die 12. The memory die 11 includes a memory plane MP for storing data and a peripheral circuit 13 provided in a periphery of the memory plane MP. The memory plane MP includes a plurality of memory blocks MB arranged in a Y direction. The memory block MB includes a plurality of memory fingers MF arranged in the Y direction. The control die 12 includes a control circuit for controlling the memory plane MP via the peripheral circuit 13 on the memory die 11.

Figure 2:
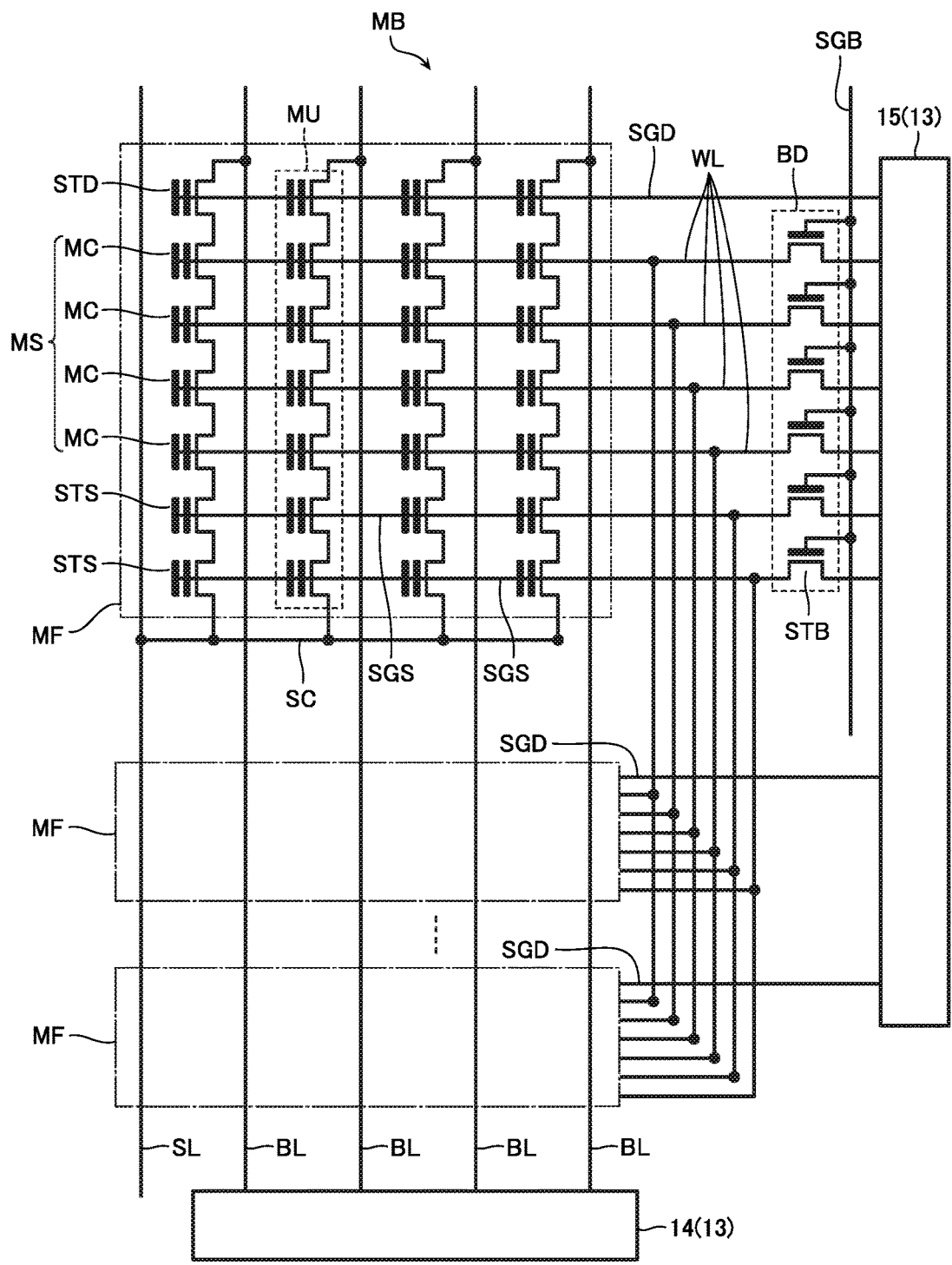
FIG. 2 is an equivalent circuit diagram showing a configuration of a memory block.

FIG. 2 is an equivalent circuit diagram showing a configuration of the memory block MB. The memory block MB is connected to a column decoder 14 in the peripheral circuit 13 via bit lines BL, to a row decoder 15 in the peripheral circuit 13 via word lines WL and select gate lines (drain select gate line SGD and source select gate line SGS), and to a source line driver (not shown) via a source line SL. Moreover, a block decoder BD is arranged between the memory block MB and the row decoder 15. For convenience of description, part of the configuration is omitted in FIG. 2.

The plurality of memory fingers MF in the memory block MB each includes a plurality of memory units MU. One end portions of the memory units MU are connected to the bit lines BL, respectively. Moreover, the other end portions of the memory units MU are connected to the source line SL via a common lower wiring SC, respectively.

The memory units MU includes a drain select gate transistor STD, a memory string MS and a source select gate transistor STS, which are connected between the bit line BL and the lower wiring SC in series. Note that in the description below, the drain select gate transistor STD and the source select gate transistor STS will sometimes simply be called "select gate transistors (STD, STD)".

The memory string MS includes a plurality of memory cells MC connected in series. The memory cell MC according to the first embodiment is a field effect transistor which includes a first semiconductor layer functioning as a channel area, a first gate insulating layer including a memory portion, and a first gate electrode, and stores data of at least 1 bit. A threshold voltage of the memory cell MC changes depending on charge amounts in the memory portion. Each of the first gate electrodes of the memory cells MC in one memory string MS is connected to each of the word lines WL, respectively. Each of the word lines WL is connected to all the memory strings MS in one memory finger MF respectively. Moreover, each of the word lines WL in one memory finger MF is connected to each of the word lines WL in the other memory fingers MF in one memory block MB respectively.

The select gate transistors (STD, STS) are field effect transistors each including a first semiconductor layer functioning as a channel area, a first gate insulating layer, and a first gate electrode. The select gate lines (SGD, SGS) are connected to the first gate electrodes of the select gate transistors (STD, STD), respectively. Each of the select gate lines (SGD, SGS) are connected to all the select gate transistors (STD, STD) in one memory finger MF respectively. Moreover, each of the drain select gate lines SGD in one memory block MB are connected to the row decoder 15 independently for each memory finger MF. On the other hand, each of the source select gate lines SGS in one memory finger MF is connected to each of the source select gate lines SGS in the other memory fingers MF in one memory block MB respectively.

Since the block decoder BD is used for selecting the memory block MB, it is provided one for each memory block MB. The block decoder BD includes a plurality of block select transistors STB. These block select transistors are field effect transistors each including a second semiconductor layer functioning as a channel area and a second gate electrode. These block select transistors STB are connected between the word line WL or source select line SGS and the row decoder 15. Moreover, a block select line SGB is connected in common to the second gate electrodes of the block select transistors.

Figure 3:
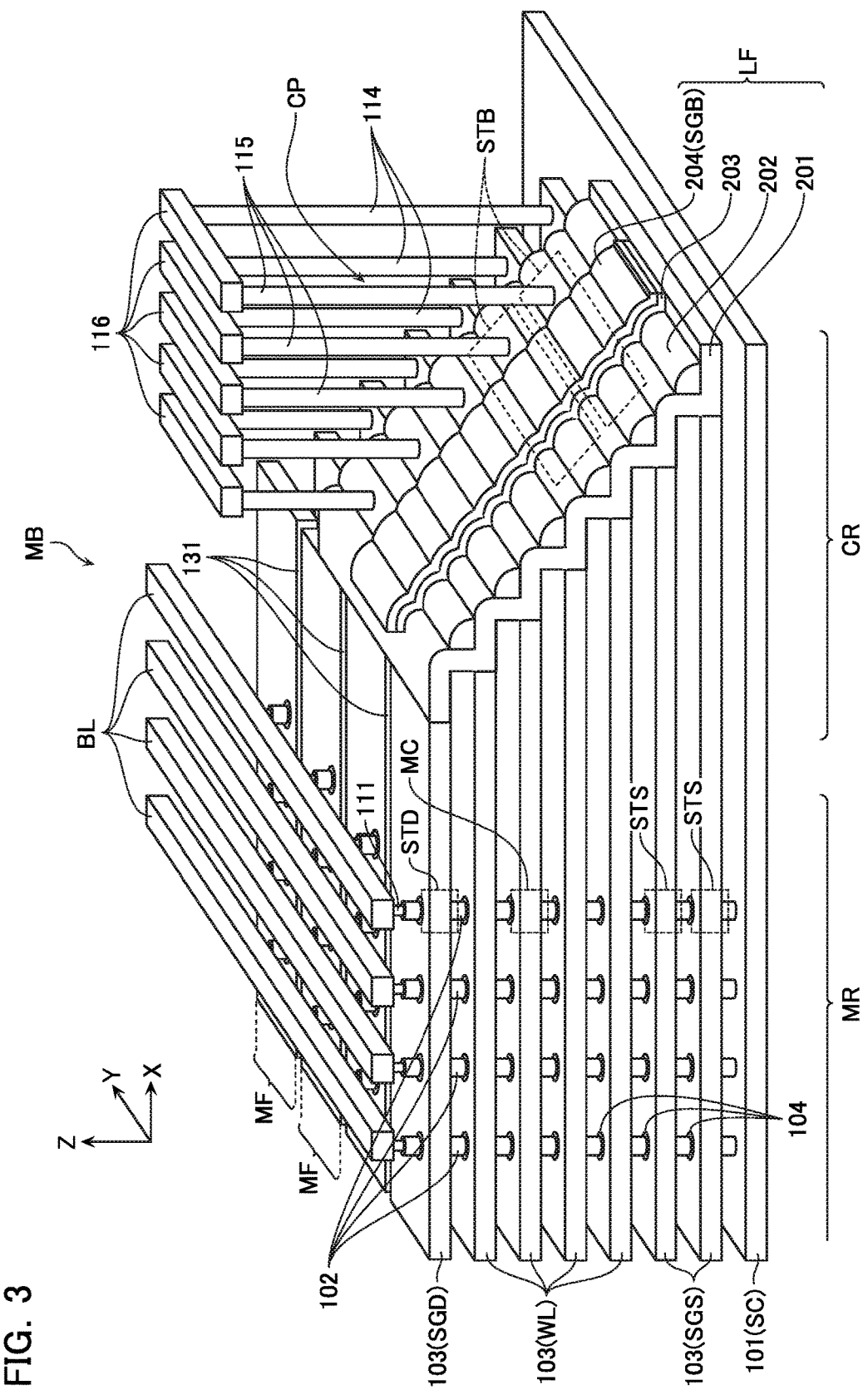
FIG. 3 is a schematic perspective view of a part denoted by "A" in FIG. 1.
Figure 4:
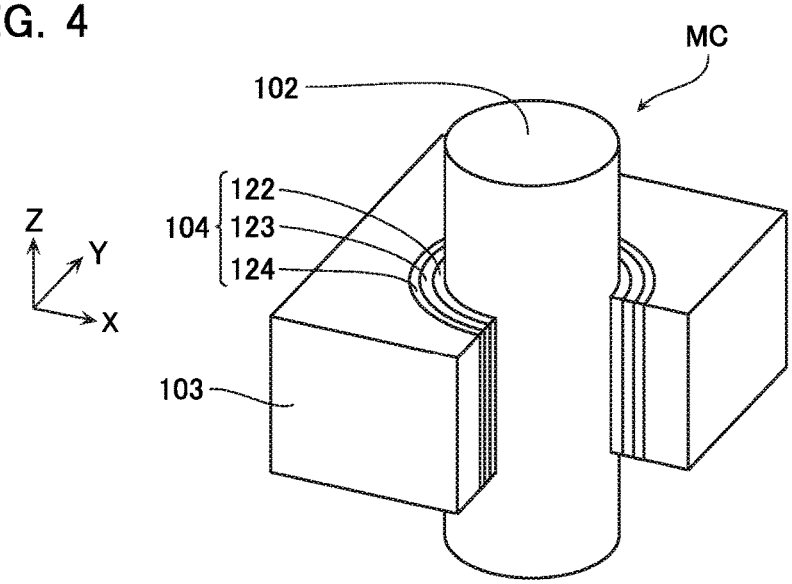
FIG. 4 is an enlarged view of a part of the configuration shown in FIG. 3.

FIG. 3 is a schematic perspective view showing the configuration of the memory block MB and corresponds to the part denoted by "A" in FIG. 1. FIG. 4 is an enlarged view of a part of the configuration shown in FIG. 3. In FIGS. 3 and 4, part of the configuration is omitted.

As shown in FIG. 3, the memory block MB includes a plurality of the memory fingers MF provided above a substrate 101. These memory fingers MF each includes a first semiconductor layer 102 extending in a Z direction, a plurality of first gate electrodes 103 arranged in the Z direction and covering the side surface of the first semiconductor layers 102, a first gate insulating layer 104 provided between the first semiconductor layer 102 and the first gate electrodes 103. Moreover, the end portions of the first gate electrodes 103 are covered with a laminated film LF. Note that in the description below, the region in which the first semiconductor layer 102 and the first gate insulating layer 104 are provided will be called "memory region MR". Additionally, the region in which the first gate electrode 103 or the like are connected to a first contact or the like will be called "contact region CR".

The substrate 101 is a semiconductor substrate formed of, for example, single crystal silicon (Si) or the like. The substrate 101 has a double well structure which includes an n-type impurity layer provided in the upper surface of the substrate 101 and a p-type impurity layer provided in an upper surface of the n-type impurity layer.

The first semiconductor layer 102 has a substantially columnar or substantially cylindrical shape extending in the Z direction and is formed of, for example, polycrystalline silicon (p-Si). The first semiconductor layer 102 functions as a channel area of the memory cell MC and the select transistor (STD, STS). The upper end portion of the first semiconductor layer 102 is connected to the peripheral circuit 13 (FIG. 1) via the bit line BL. The lower end portion of the first semiconductor layer 102 is connected to the peripheral circuit 13 (FIG. 1) via the lower wiring SC. Although the upper surface of the substrate 101 is utilized as the lower wiring SC in the example shown in FIG. 3, the lower wiring SC may be provided separately from the substrate 101.

The first gate electrodes 103 are plate-like conductive layers extending in the X direction and are formed of, for example, a laminated film of a titanium nitride (TiN) film and a tungsten (W) film, or the like. The first gate electrodes 103 face the first semiconductor layers 102 from the X direction and the Y direction, and function as the word lines WL, the gate electrodes of the memory cells MC, the select gate lines (SGD, SGS), and the gate electrodes of the select transistors (STD, STS). These first gate electrodes 103 are separated from each other via first slits 131. The end portions of the first gate electrodes 103 in the X direction are provided in a contact region CR. The positions of these end portions in the X direction are different from each other and totally form a stepped structure. Note that in the description below, such a stepped structure will be called "contact portion CP". The plurality of the first gate electrodes 103 are connected to the first contacts 114 extending in the Z direction, respectively.

The first gate insulating layer 104 includes, as shown in FIG. 4, a tunnel insulating layer 122, a charge accumulation layer 123, and a block insulating layer 124 provided between the first semiconductor layer 102 and the first gate electrodes 103. The tunnel insulating layer 122 and the block insulating layer 124 are formed of, for example, silicon dioxide ($SiO_2$) or the like. The charge accumulation layer 123 is formed of, for example, silicon nitride ($Si_3N_4$) or the like, and functions as the memory portion. As shown in FIG. 3, each of the memory cells MC arranged in the Z direction includes the charge accumulation layer 123. These charge accumulation layers 123 may be connected to each other or separated from each other for each memory cell MC.

The laminated film LF covers at least parts of the upper surfaces and the side surfaces intersecting the X direction, of the first gate electrodes 103. The laminated film LF includes a first insulating layer 201 laminated on the contact portion CP, a plurality of second semiconductor layers 202 provided on the first insulating layer 201, a second gate insulating layer 203 provided on the plurality of the second semiconductor layers 202, and a second gate electrode 204 provided on the second insulating layer 203.

The first insulating layer 201 is formed of, for example, silicon dioxide ($SiO_2$), and is configured into a stepped shape along the stepwise shape of the contact portion CP. Namely, the first insulating layer 201 covers at least parts of the upper surfaces and the side surfaces intersecting the X direction, of the plurality of the first gate electrodes 103.

The second semiconductor layers 202 are formed of, for example, polycrystalline silicon (p-Si) or the like. The positions of the plurality of the second semiconductor layers 202 in the Z direction are different from each other. Additionally, the positions of the plurality of the second semiconductor layers 202 in the X direction are different from each other. These second semiconductor layers 202 are located above the end portions of the first gate electrodes 103 in the X direction via the first insulating layer 201, respectively. The upper surfaces and the side surfaces intersecting the X direction, of the second semiconductor layers 202, form a continuous curved surface which is convex upward. Moreover, these second semiconductor layers 202 extend in the Y direction, respectively, and function as a channel area of a block select transistor STB. A part of the second semiconductor layer 202 in the Y direction is connected to the second contact 115 extending in the Z direction, and to the first gate electrode 103 via the second contact 115, the wiring 116 extending in the Y direction and the first contact 114. Moreover, another part of the second semiconductor layer 202 in the Y direction is connected to a third contact 117 (FIG. 7) and to the peripheral circuit 13 via the third contact 117.

The second gate insulating layer 203 is formed of, for example, silicon dioxide ($SiO_2$) and functions as a gate insulating layer of the block select transistor STB. The second gate insulating layer 203 is provided continuously along the upper surfaces of the first insulating layer 201 and the plurality of the second semiconductor layers 202. Moreover, the second gate insulating layer 203 is provided between the second contact 115 and the third contact 117 (FIG. 7) in the Y direction.

Figure 7:
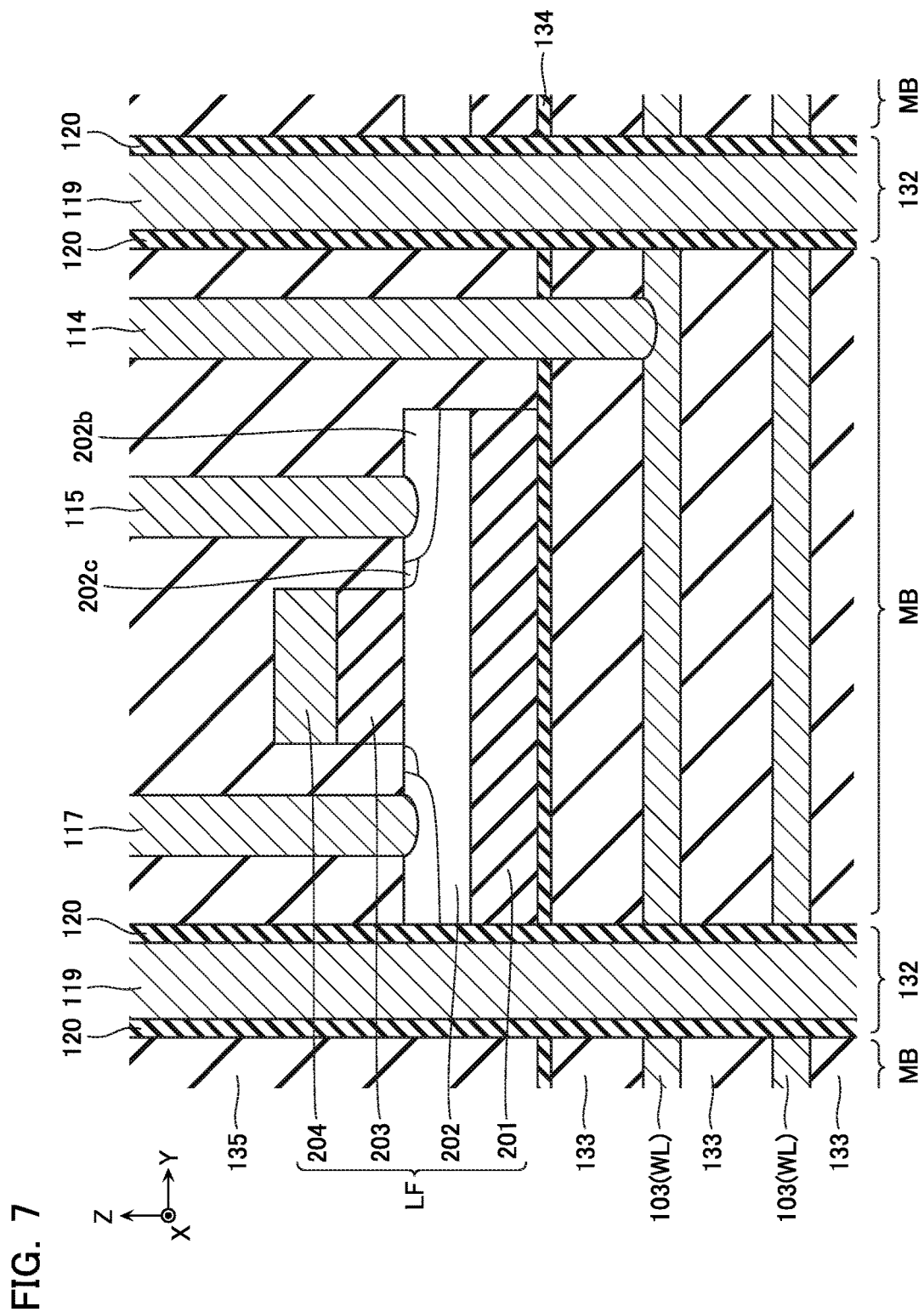
FIG. 7 is a cross-sectional view taken along line D-D' of the configuration shown in FIG. 5.

The second gate electrode 204 is formed of, for example, polycrystalline silicon (p-Si), a laminated film of a titanium nitride film and a tungsten film or the like and functions as a block select line SGB and a gate electrode of the block select transistor STB. The second gate electrode 204 is provided continuously along the upper surface of the second gate insulating layer 203 and faces the upper surfaces of the plurality of the second semiconductor layers 202. Moreover, the second gate electrode 204 is provided in the range between the second contact 115 and the third contact 117 (FIG. 7).

Figure 5:
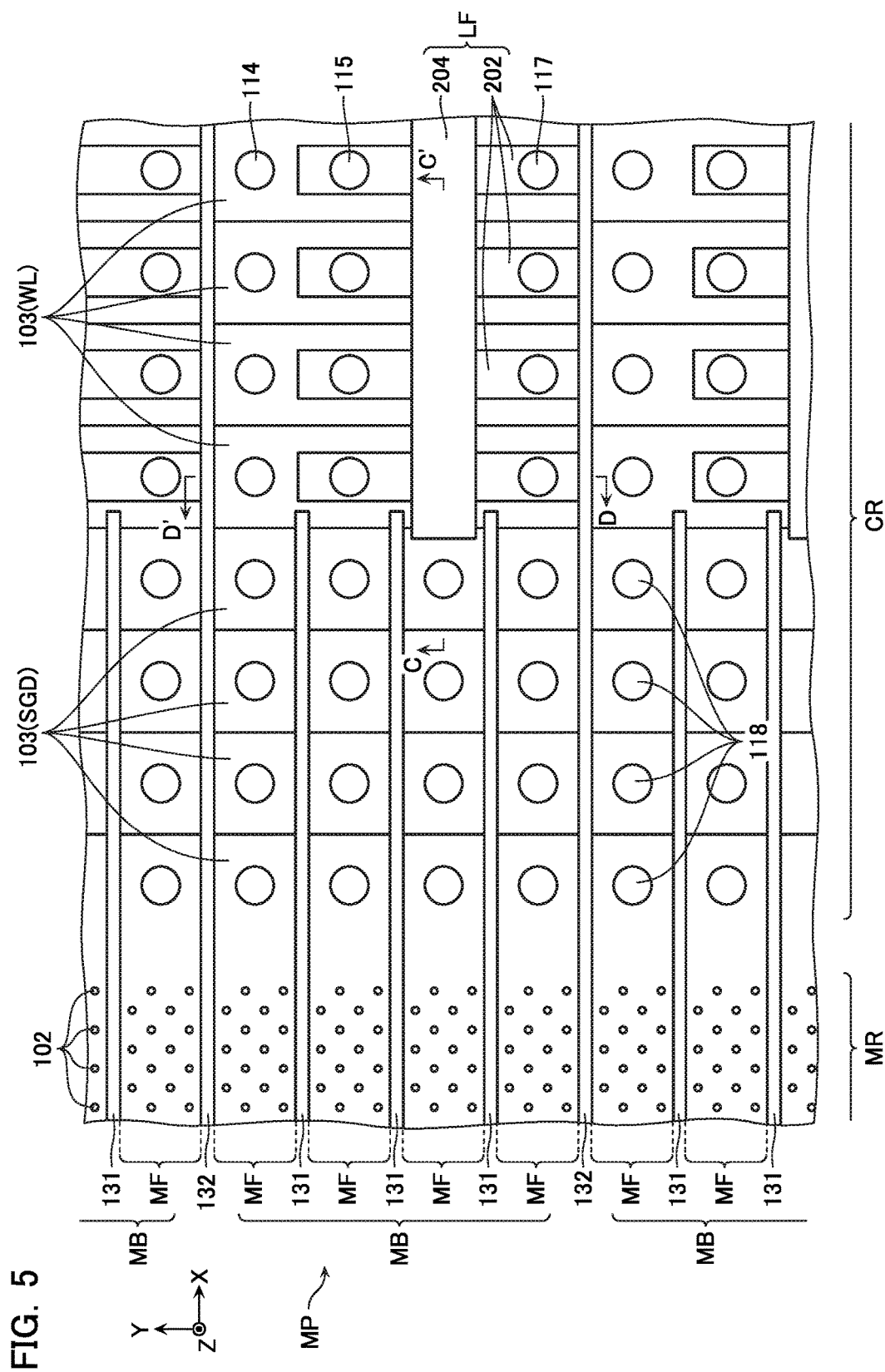
FIG. 5 is a plan view of a part denoted by "B" in FIG. 1.

Next, with reference to FIGS. 5 to 7, there will be described a configuration of the semiconductor memory device of the first embodiment in more detail. FIG. 5 is a plan view of a part denoted by "B" in FIG. 1. Note that part of the configuration is omitted in FIG. 5.

As shown in FIG. 5, the memory plane MP includes a plurality of memory blocks MB arranged in the Y direction via second slits 132. The second slits 132 extend in the X direction over the entire region of the memory region MR and the contact region CR.

The memory block MB includes a plurality of the memory fingers MF in the Y direction via first slits 131. The first slits 131 extend in the X direction over the entire MR region and a part of the contact region CR.

In the memory region MR, a plurality of the first semiconductor layers 102 are arranged in each memory finger, for example, in staggered manner. As described above, the first gate insulating layers 103 (FIG. 3) are arranged between these first semiconductor layers 102 and the first gate electrodes 103.

In a part of the contact region CR, the end portions in the X direction of the first gate electrodes 103 corresponding to the drain select lines SGD are arranged. These end portions are arranged in a matrix manner in the X direction and the Y direction, and connected to contacts 118, respectively.

In another part of the contact region CR, the end portions in the X direction of the first gate electrodes 103 corresponding to the word line WL are arranged. At these end portions, the plurality of the first gate electrodes 103 arranged adjacent to each other in the Y direction are connected to each other. In other words, these first gate electrodes 103 are parts of one conductive layer formed in comb shape by the first slits 131. On these end portions, the first contact 114, the second contact 115, the second gate electrode 204, and the third contact 117 are arranged in the Y direction from one end to the other end. Moreover, the second semiconductor layers 202 extending in the Y direction are arranged on these end portions. One end portion of the second semiconductor layer 202 in the Y direction is provided between the first contact 114 and the second contact 115, and the other end portion of the second semiconductor layer 202 in the Y direction is provided at an end portions of the memory block MB. Moreover, the second gate electrode 204 extends in the X direction as seen from the Z direction and covers the end portions of the plurality of the first gate electrodes in the X direction.

Figure 6:
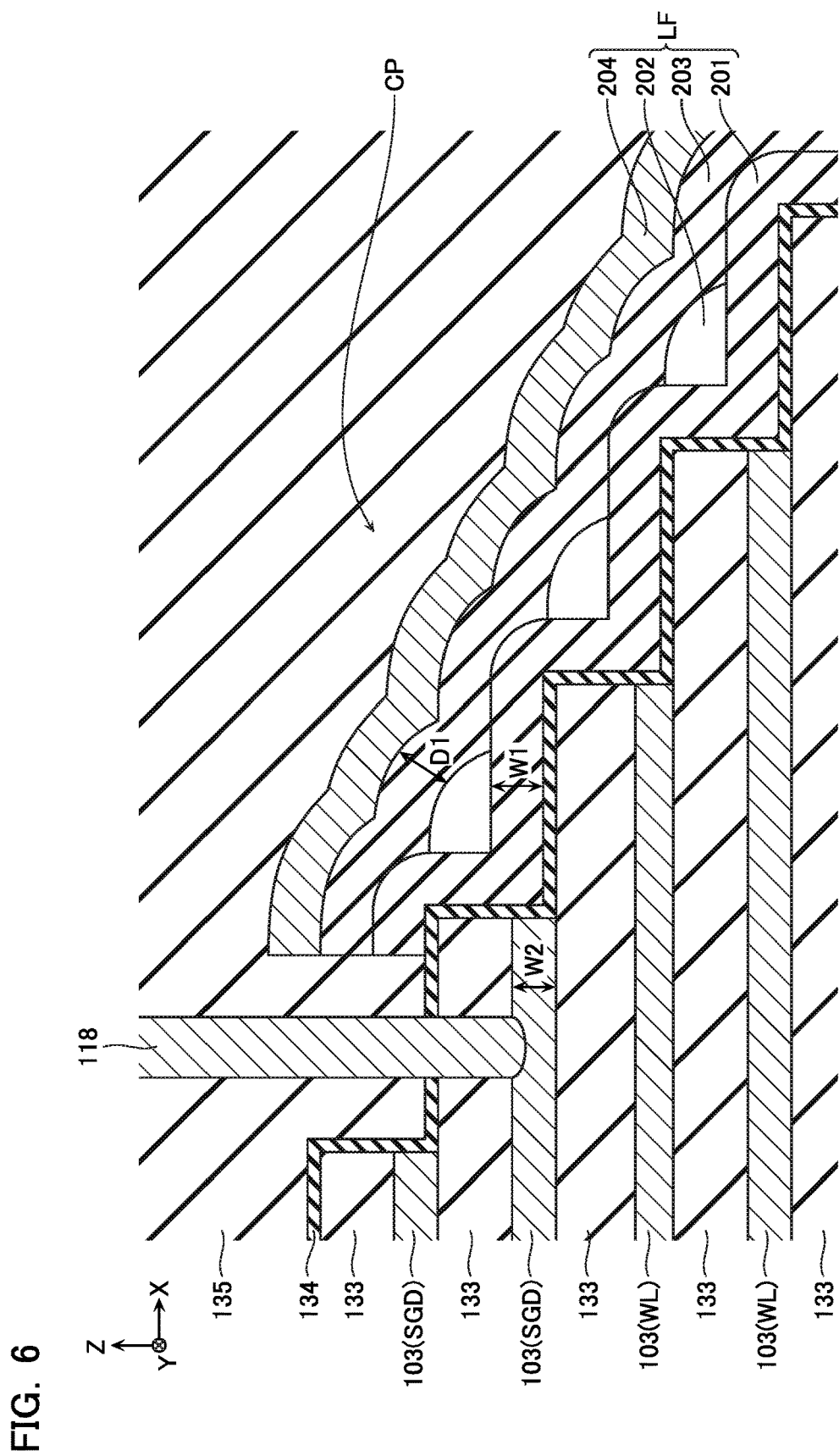
FIG. 6 is a cross-sectional view taken along line C-C' of the configuration shown in FIG. 5.

FIG. 6 is a cross-sectional view taken along line C-C' of the configuration shown in FIG. 5.

The contact portion CP includes, in addition to the end portions of the plurality of the first gate electrodes 103 in the X direction, end portions of a plurality of second insulating layers 133 in the X direction and a stopper layer 134. The plurality of the second insulating layers 133 are formed of, for example, silicon dioxide ($SiO_2$). The plurality of the second insulating layers 133 and the plurality of the first gate electrodes 103 are alternately arranged in the Z direction. The second insulating layers 133 extend in the X direction. The second insulating layers 133 cover the upper surface of the end portions of the first gate electrodes 103 in the X direction. The stopper layer 134 and the laminated film LF cover at least parts of the upper surfaces and the side surfaces intersecting the X direction of the plurality of the second insulating layers 133, and at least parts of the side surfaces intersecting the X direction of the plurality of the first gate electrodes 103. The stopper layer 134 is formed of, for example, silicon nitride ($Si_3N_4$) or the like and is used as an etching stopper in a manufacturing process.

In the laminated film LF, the thickness W1 of the first insulating layer 201 in the X direction is larger than the thickness W2 of the first insulating layer 103 in the Z direction. Therefore, the position in the Z direction of the upper surface of one first gate electrode is lower than that of the lower surface of the second semiconductor layer 202 closest to this first gate electrode 103. Furthermore, the distance D1 between the second semiconductor layer 202 and the second gate electrode 204 (the thickness of the second gate insulating layer 203) is smaller than the thickness W1 of the first insulating layer 201 in the Z direction.

Additionally, the contact portion CP and the laminated film LF are covered with an insulating layer 135 formed of, for example, silicon dioxide ($SiO_2$). The contact 118 extends in the Z direction and penetrates this insulating layer 135, the stopper layer 134 and the second insulating layer 133 to be connected to the first gate electrode 103.

FIG. 7 is a cross-sectional view taken along line D-D' of the configuration shown in FIG. 5.

To the memory block MB, the first contact 114, the second contact 115 and the third contact 117 are connected. The first contact 114 extends in the Z direction and penetrates the insulating layer 135, the stopper layer 134 and the second insulating layer 133 to be connected to the first gate electrode 103. Both of the second contact 115 and the third contact 117 extend in the Z direction and penetrate the insulating layer 135 to be connected to the second semiconductor layer 202.

Note that first impurity regions 202b doped with an n-type impurity are formed in a contact portion of the second semiconductor layer 202 with the second contact 115 and a contact portion of the second semiconductor layer 202 with the third contact 117. Additionally, second impurity regions 202c doped with an n-type impurity are formed between the portion of the second semiconductor layer 202 facing the second gate electrode 204 and the first impurity region 202b. The impurity concentration in the first impurity region 202b is higher than that in the second impurity region 202c.

On aside surface of the memory block MB intersecting the Y direction, the contact 119 is provided via an insulating layer 120. The contact 119 connects the lower wiring SC with the source line SL (FIG. 2). Additionally, though not shown in Figure, the insulating layer 120 and the contact 119 may be provided also on the side surface of the memory finger MF intersecting the Y direction.

[Manufacturing Method]

FIGS. 8 to 28 are plan views and cross-sectional views showing the method of manufacturing the semiconductor memory device according to the first embodiment and corresponds to the part shown in FIG. 5, 6 or 7.

Figure 8:
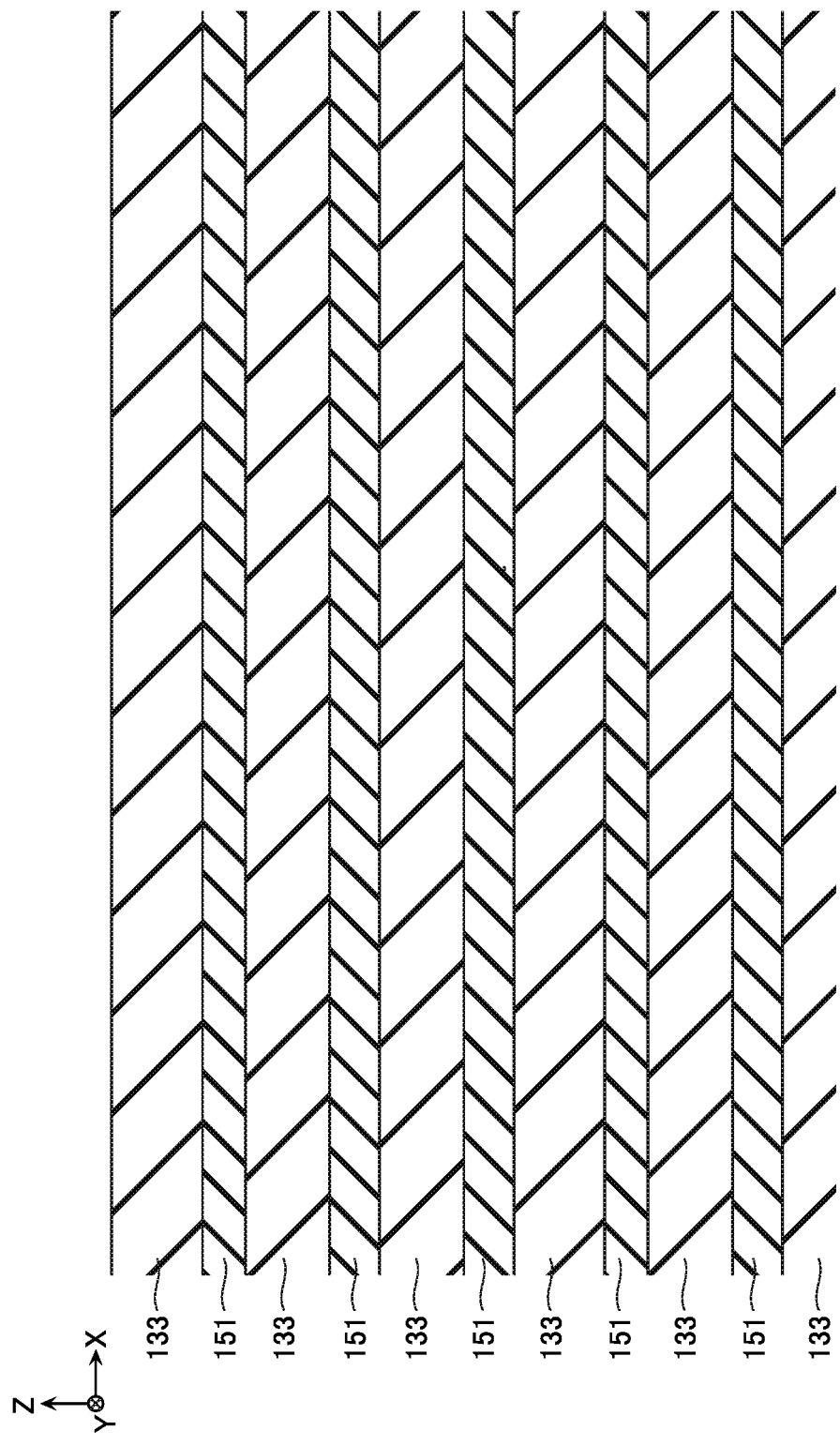
FIG. 8 is a view for describing a method of manufacturing the semiconductor memory device according to the first embodiment.

In this manufacturing method, as shown in FIG. 8, the second insulating layers 133 and sacrifice layers 151 are alternately formed. The sacrifice layers 151 are formed of, for example, silicon nitride ($Si_3N_4$) or the like. Film formation is performed by, for example, a chemical vapor deposition (CVD) or the like.

Figure 9:
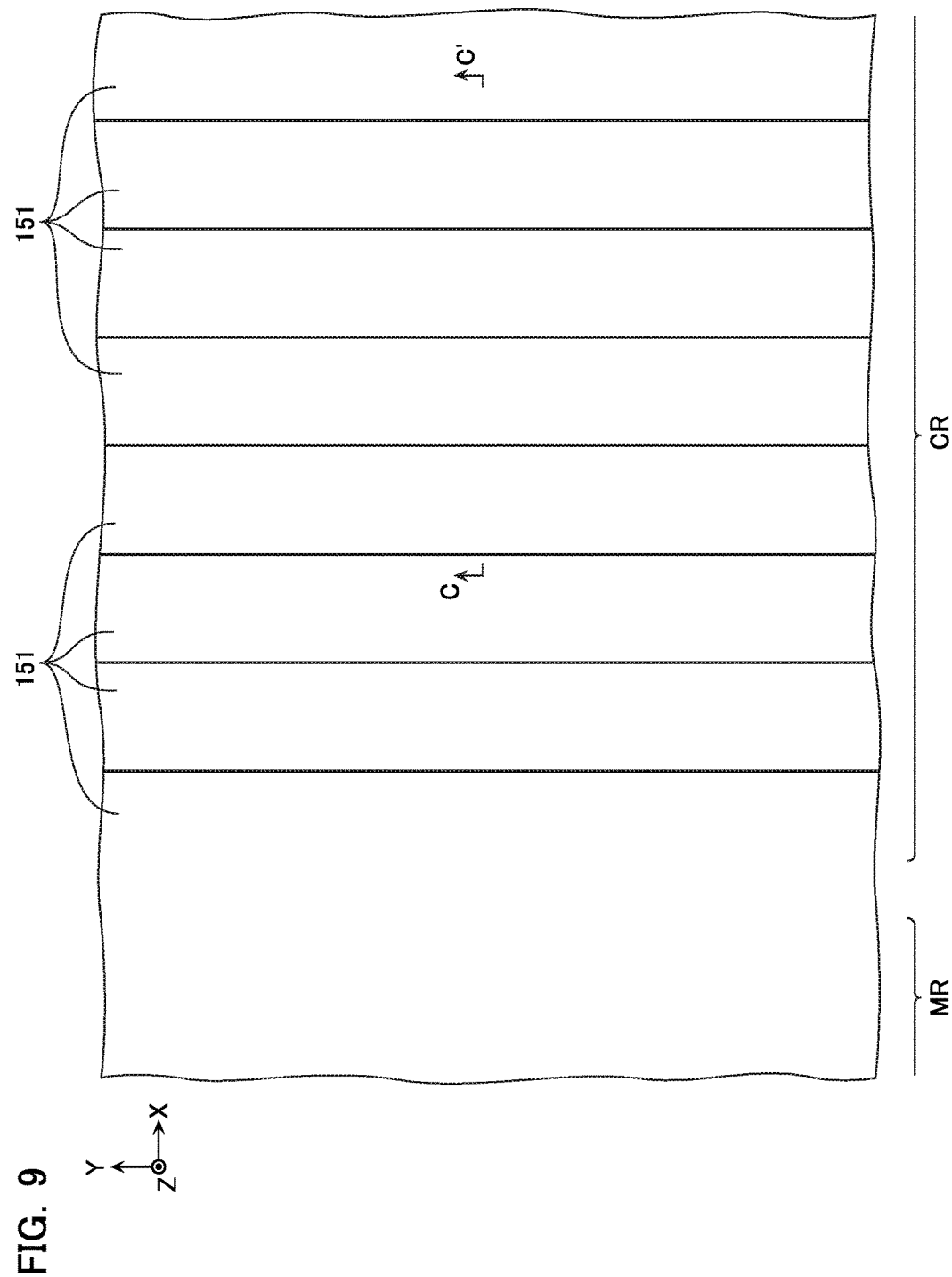
FIG. 9 is a schematic plan view showing the method of manufacturing the semiconductor memory device.
Figure 10:
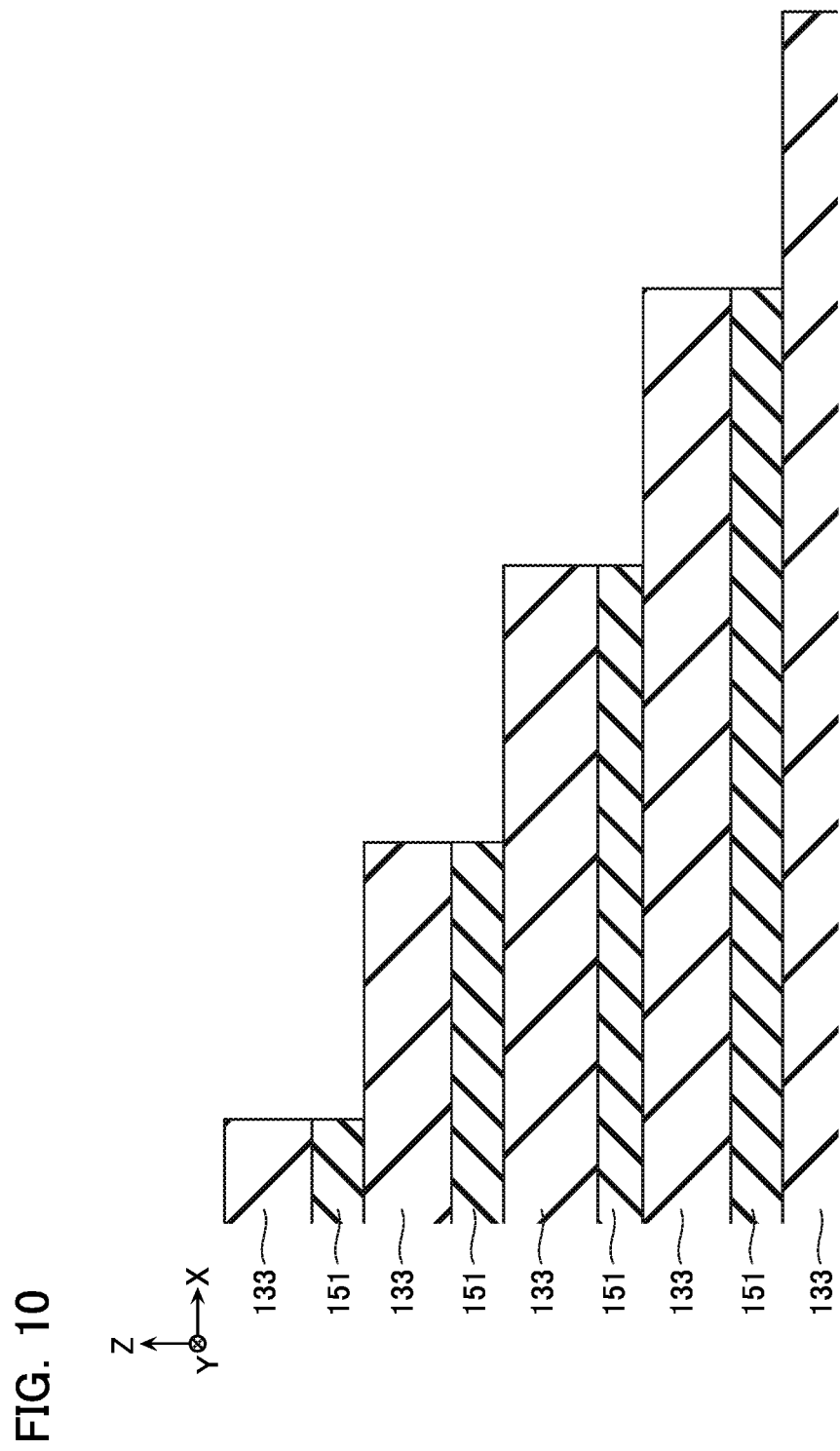
FIG. 10 is a schematic cross-sectional view showing the method of manufacturing the semiconductor memory device.

Subsequently, as shown in FIGS. 9 and 10, the second insulating layers 133 and sacrifice layers 151 are processed to form a stepped structure in the contact region CR. For example, a resist film is formed on the configuration shown in FIG. 8. Subsequently, removal of the second insulating layer 133 by means of wet etching using hydrofluoric acid, removal of the sacrifice layers 151 by means of wet etching using phosphoric acid and slimming of the resist film in the X direction are repeatedly performed.

Figure 11:
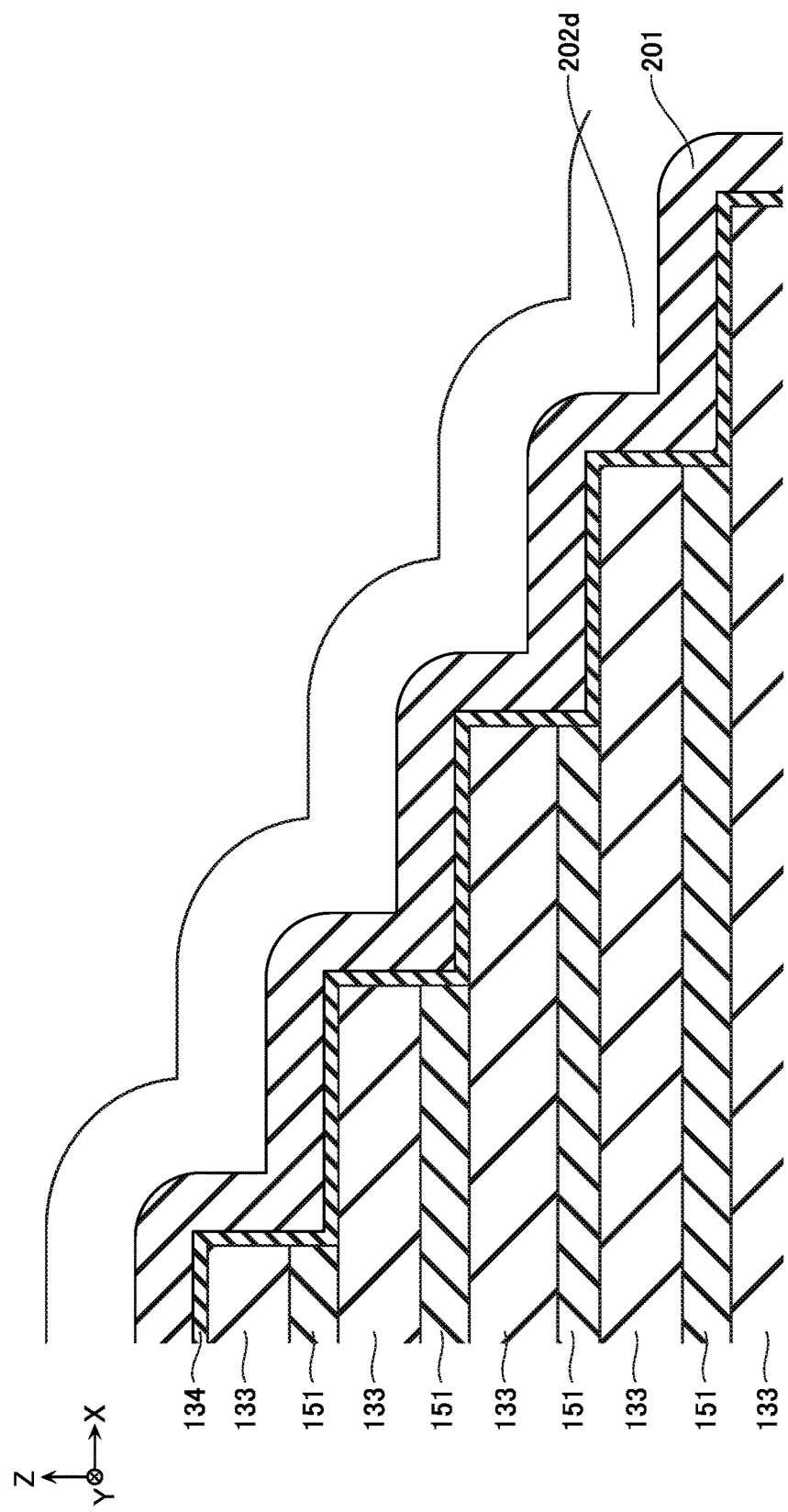
FIG. 11 is a schematic cross-sectional view showing the method of manufacturing the semiconductor memory device.
Figure 12:
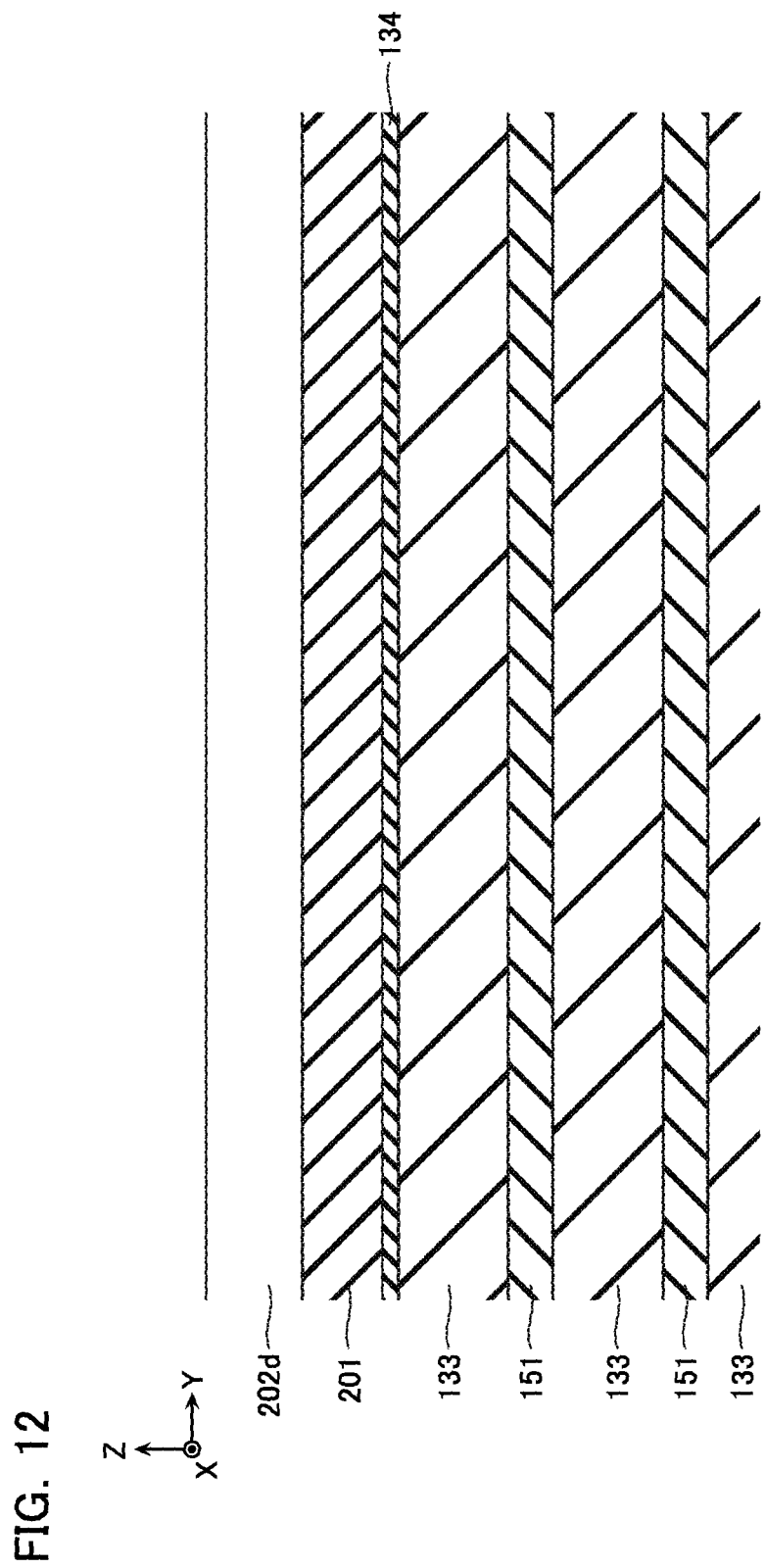
FIG. 12 is a schematic cross-sectional view showing the method of manufacturing the semiconductor memory device.

Subsequently, as shown in FIGS. 11 and 12, the stopper layer 134, the first insulating layer 201, and a semiconductor layer 202d are formed on the stepped structure. These stopper layer 134, first insulating layer 201 and semiconductor layer 202d are formed stepwise along the stepped structure. For example, CVD or the like is used for film formation. Moreover, the semiconductor layer 202d is formed by depositing a semiconductor layer formed of, for example, amorphous silicon (a-Si) and subjecting it to annealing or the like to reform the crystal structure of the semiconductor layer to polycrystalline silicon (p-Si).

Figure 13:
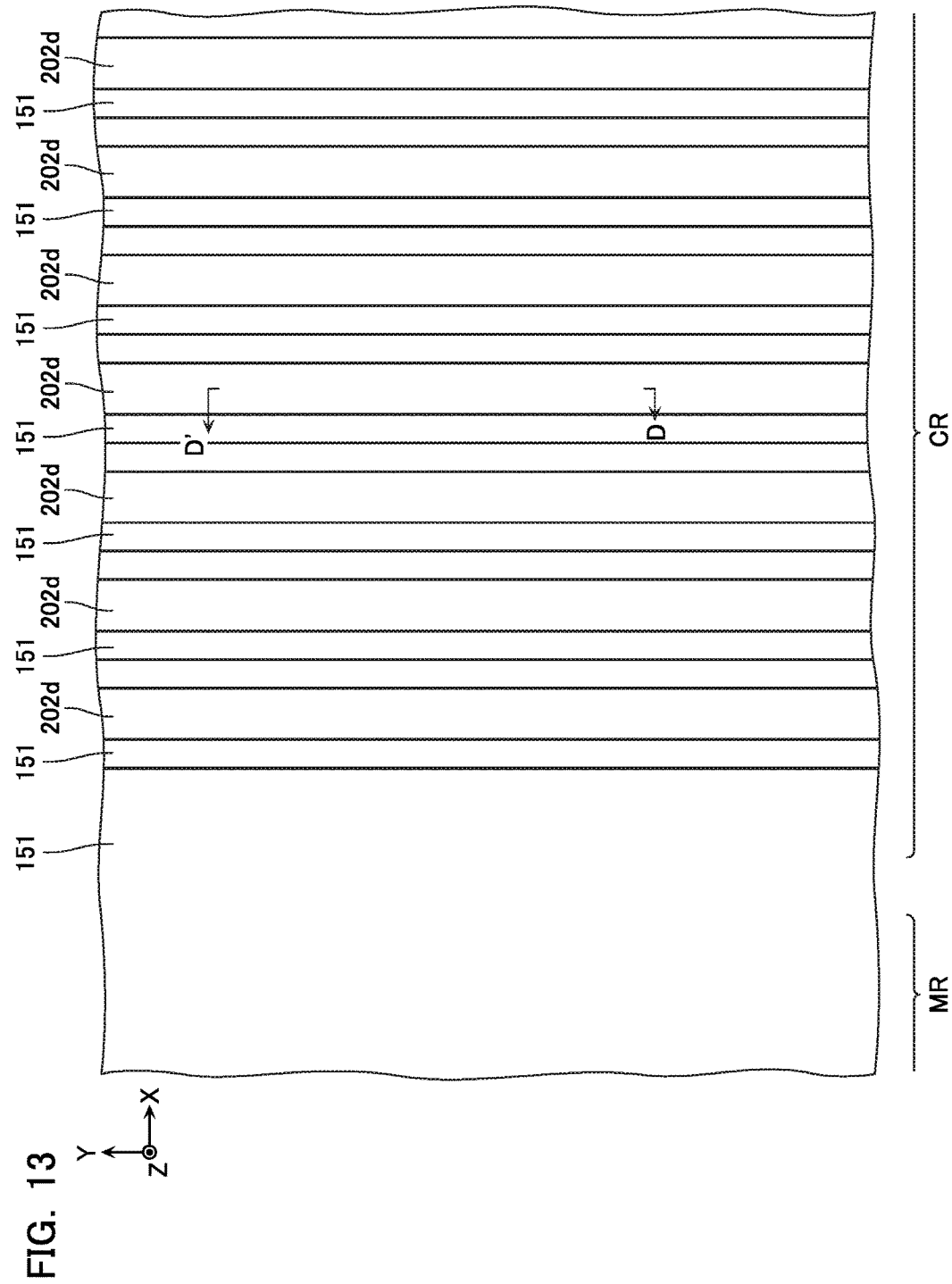
FIG. 13 is a schematic plan view showing the method of manufacturing the semiconductor memory device.
Figure 14:
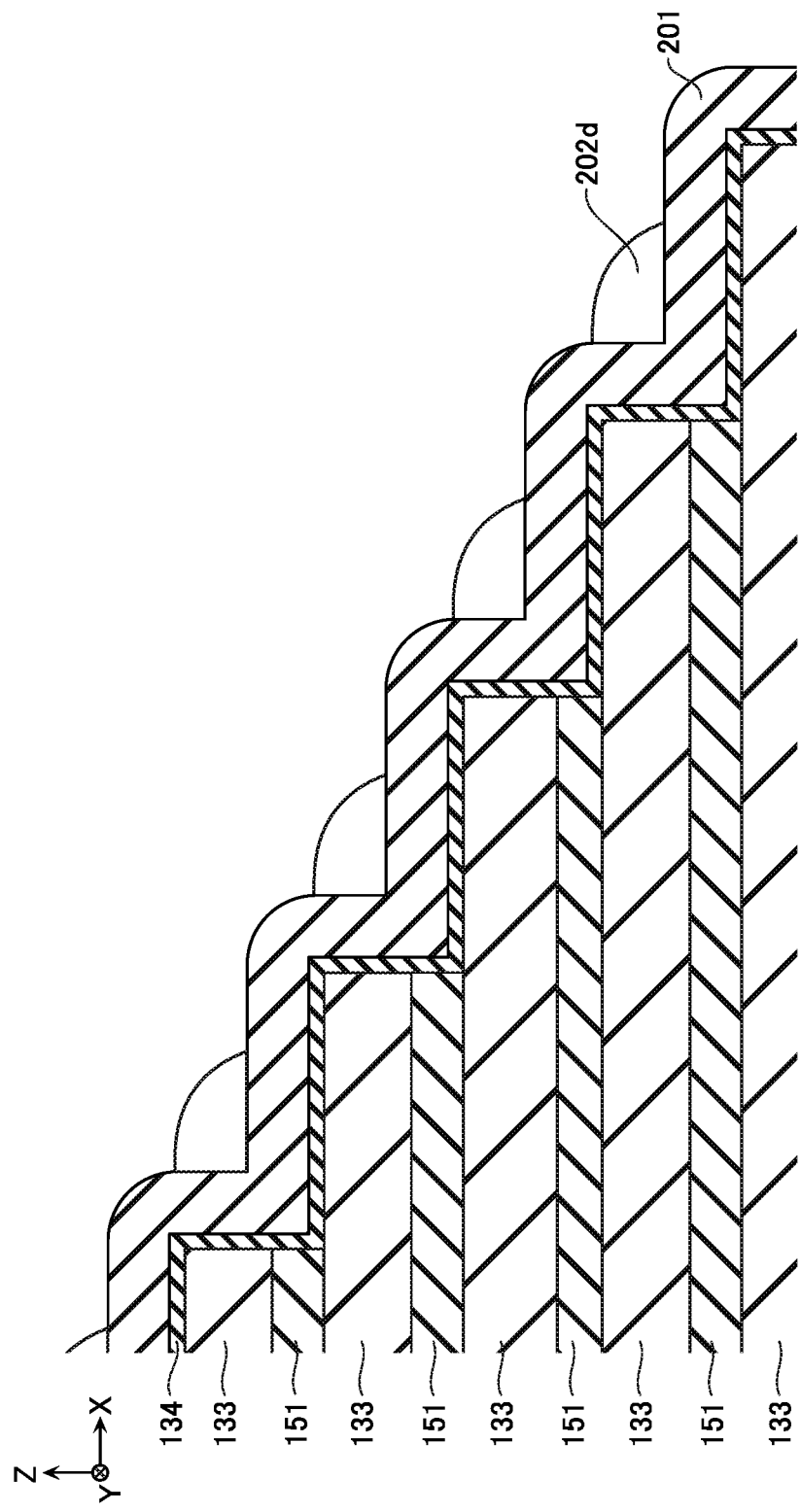
FIG. 14 is a schematic cross-sectional view showing the method of manufacturing the semiconductor memory device.

Subsequently, as shown in FIGS. 13 and 14, the semiconductor layer 202d is divided in the Z direction and the X direction. This step is performed by means of an anisotropic etching such as a reactive ion etching (RIE) or the like. As described with reference to FIG. 11 or the like, the semiconductor layer 202d is formed in a stepped form. In other words, the thickness of the semiconductor layer 202d in the Z direction is small in the flat portion and large in the stepped portion. Therefore, when the semiconductor layer 202d is subjected to the anisotropic etching, the flat portion of the semiconductor layer 202d is removed before the stepped portion is removed. As a result, the semiconductor layer 202d is divided in the Z direction and the X direction.

Figure 15:
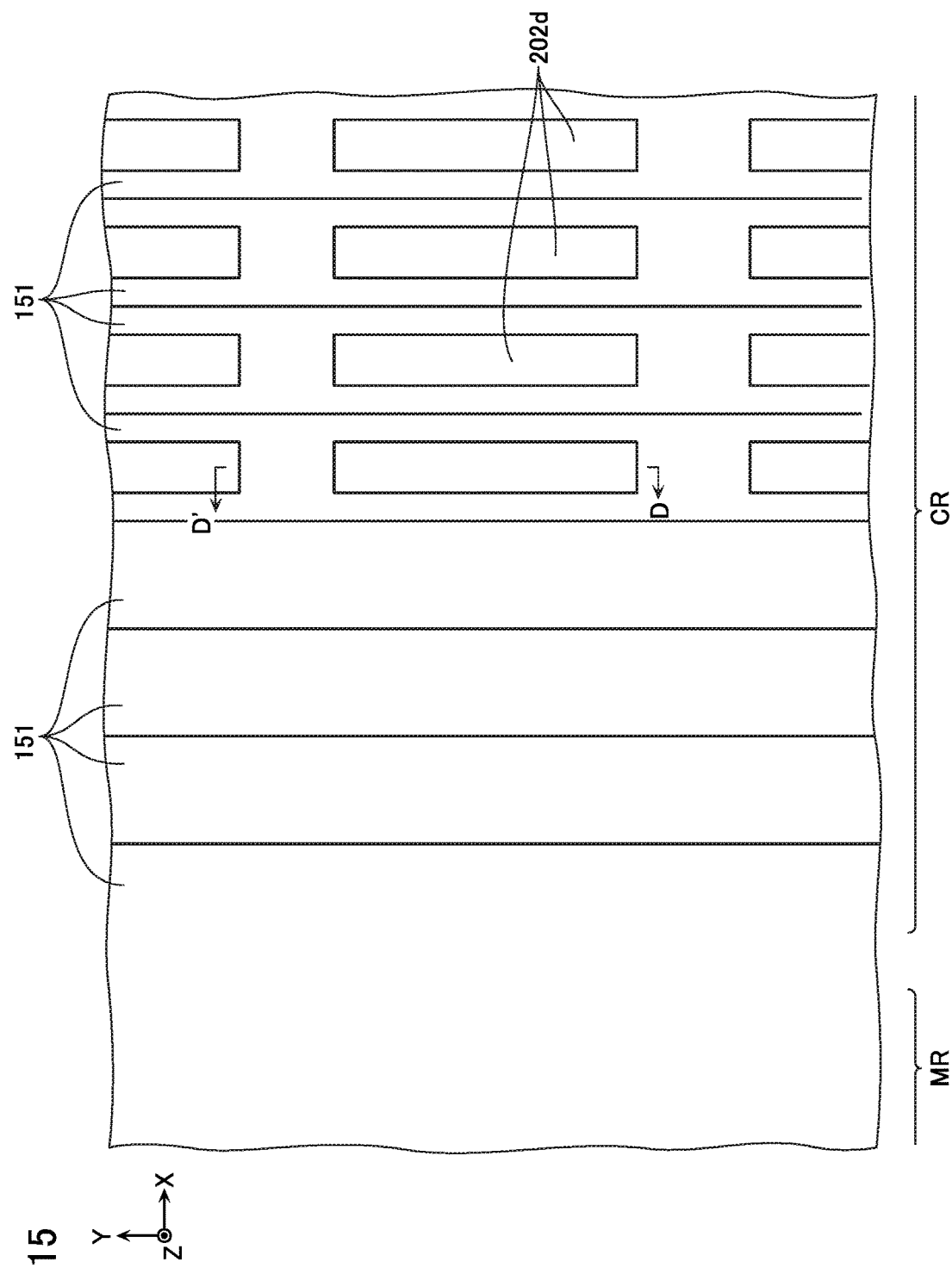
FIG. 15 is a schematic plan view showing the method of manufacturing the semiconductor memory device.
Figure 16:
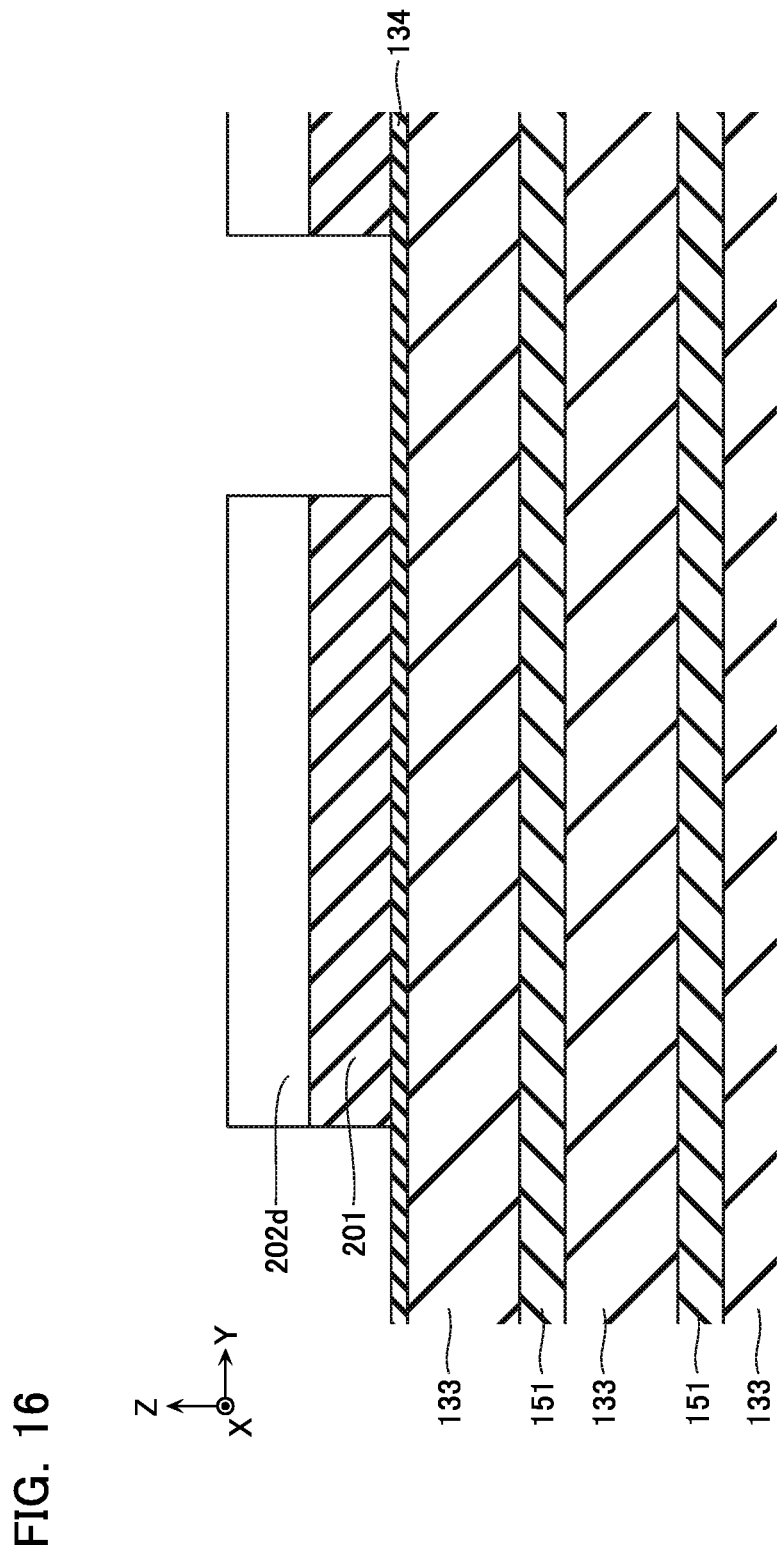
FIG. 16 is a schematic cross-sectional view showing the method of manufacturing the semiconductor memory device.

Subsequently, as shown in FIGS. 15 and 16, the semiconductor layer 202d is divided in the Y direction. Moreover, some of the divided portions of the semiconductor layer 202d are removed.

Figure 17:
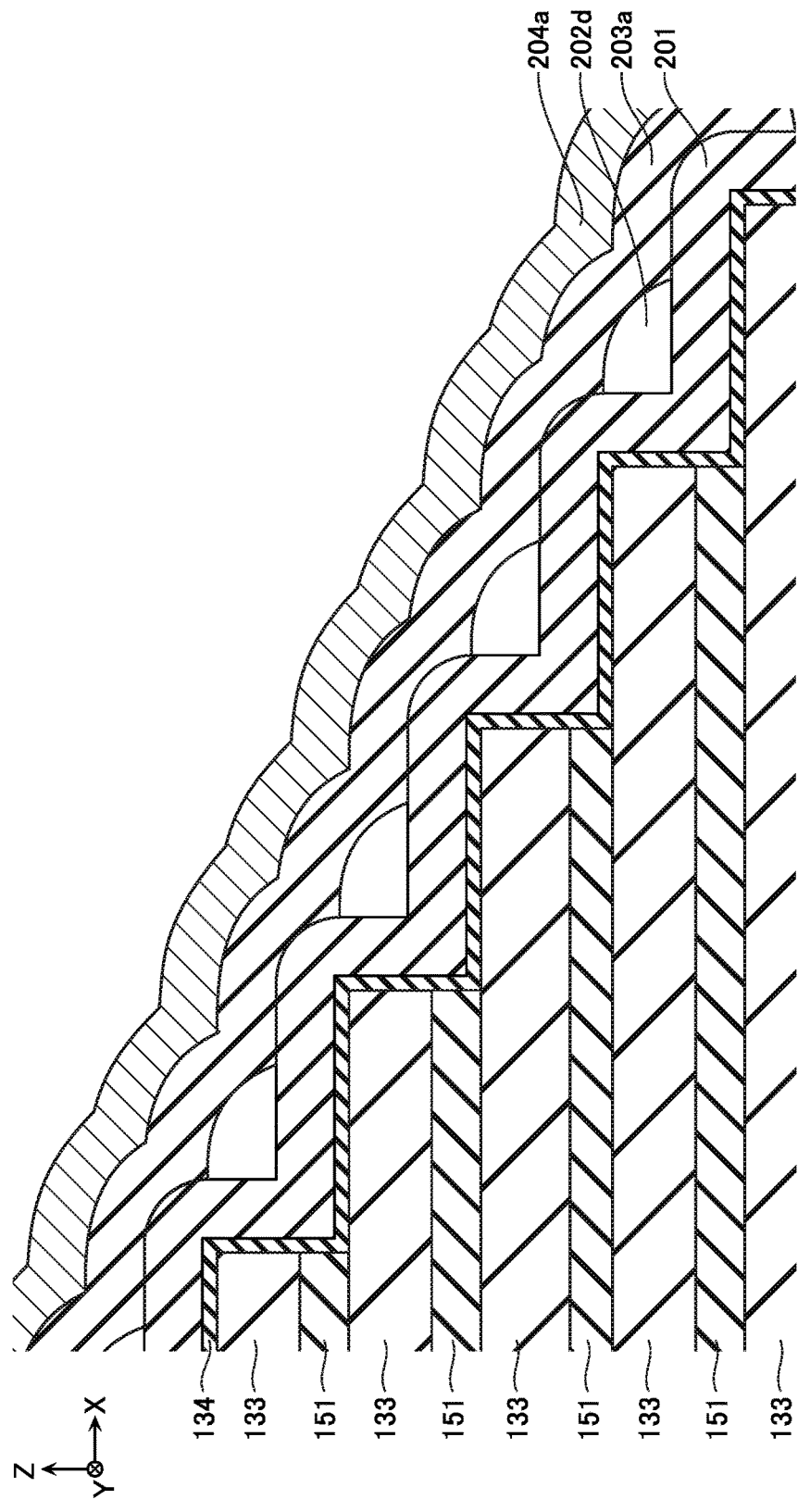
FIG. 17 is a schematic cross-sectional view showing the method of manufacturing the semiconductor memory device.

Subsequently, as shown in FIG. 17, an insulating layer 203a and a conductive layer 204a are formed on the upper surface of the first insulating layer 201 and the semiconductor layer 202d.

Figure 18:
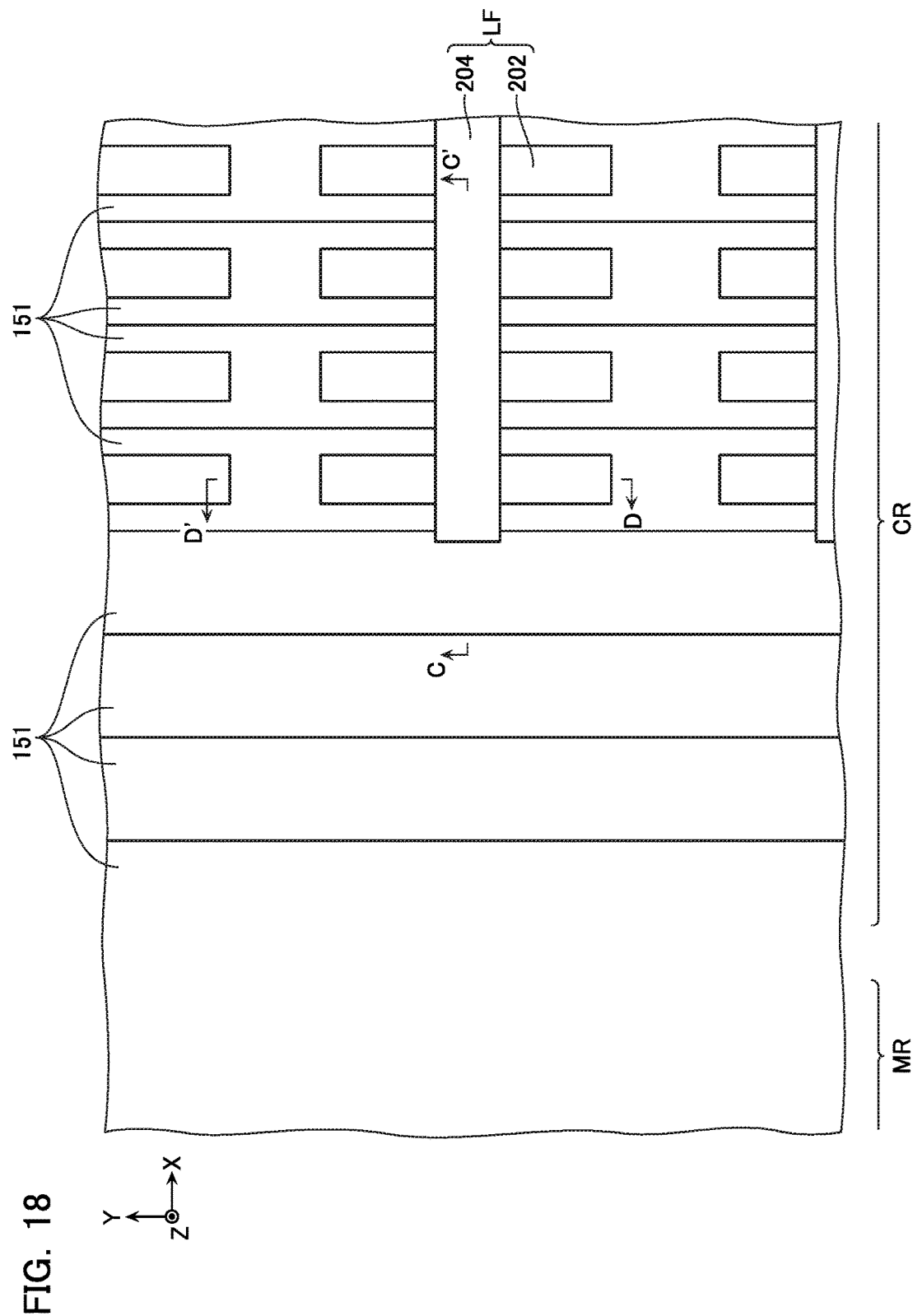
FIG. 18 is a schematic plan view showing the method of manufacturing the semiconductor memory device.
Figure 19:
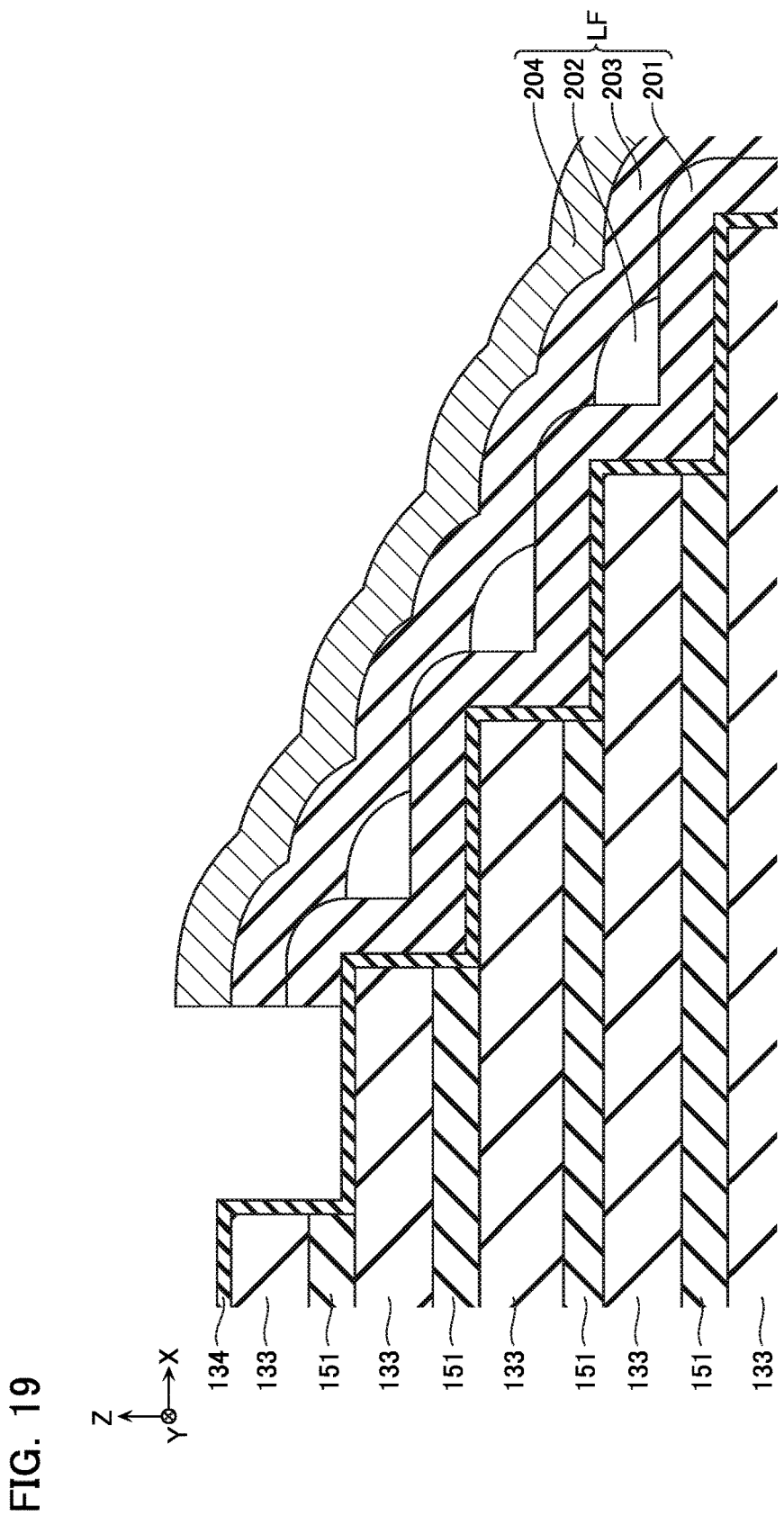
FIG. 19 is a schematic cross-sectional view showing the method of manufacturing the semiconductor memory device.
Figure 20:
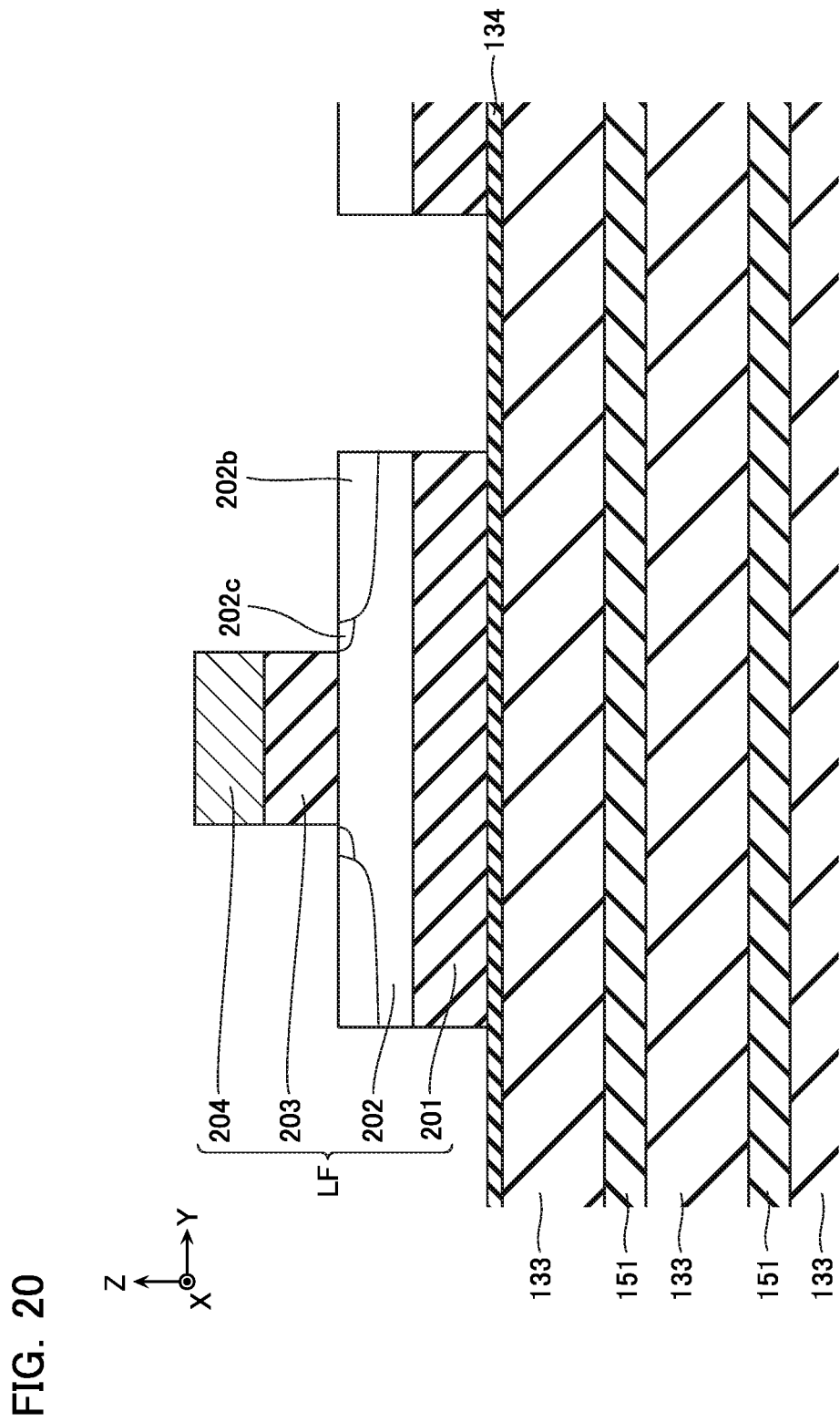
FIG. 20 is a schematic cross-sectional view showing the method of manufacturing the semiconductor memory device.

Subsequently, as shown in FIGS. 18 to 20, the insulating layer 203a and the conductive layer 204a are processed to form the second gate insulating layer 203 and the second gate electrode 204. This step is performed by means of an anisotropic etching such as a reactive ion etching (RIE) or the like. Additionally, as shown in FIG. 20, an n-type impurity is implanted in the surface of the semiconductor layer 202d to form the first impurity region 202b and the second impurity region 202c, thereby forming the second semiconductor layer 202. As a result, the laminated film LF is formed.

Figure 21:
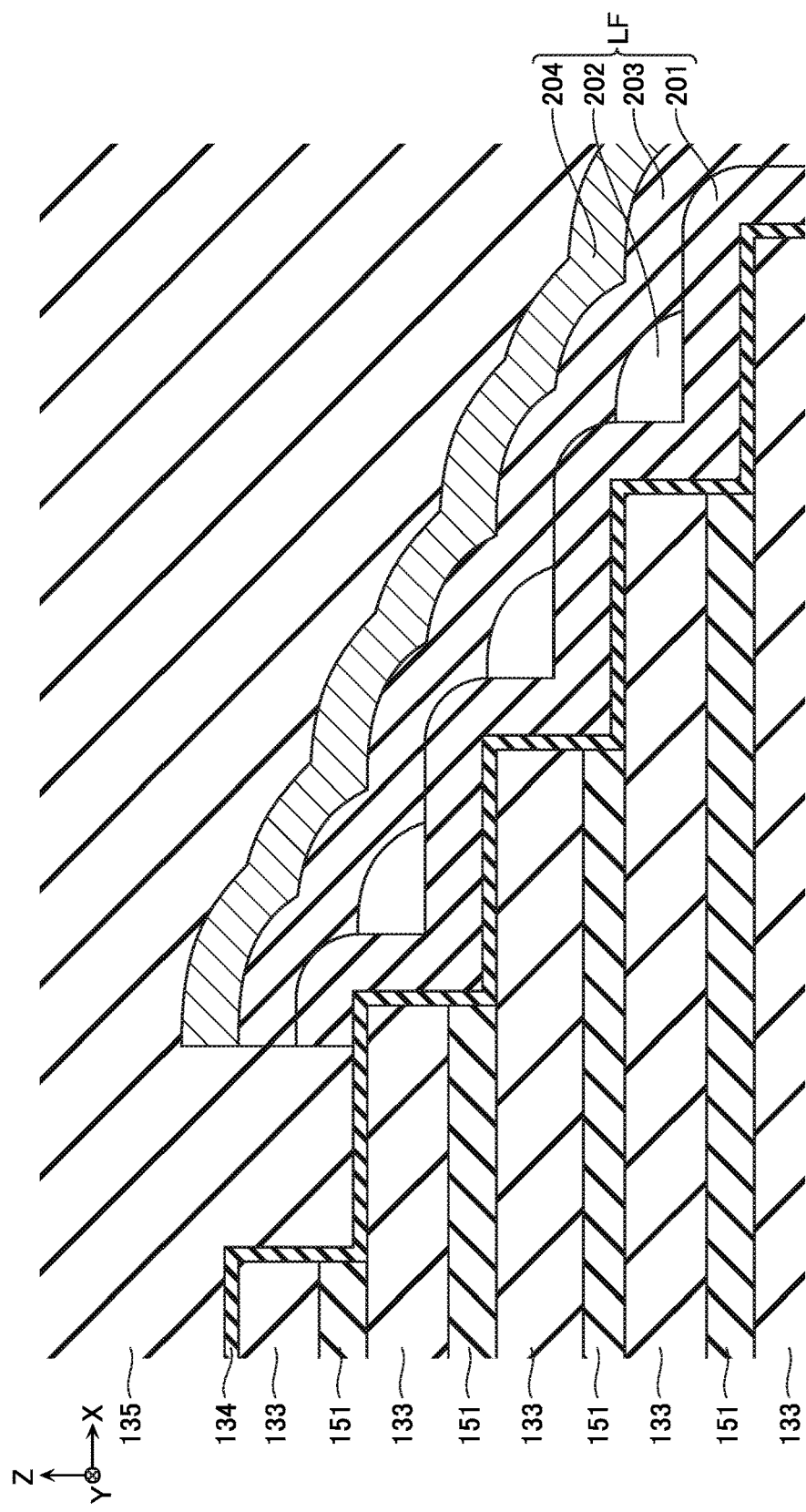
FIG. 21 is a schematic cross-sectional view showing the method of manufacturing the semiconductor memory device.
Figure 22:
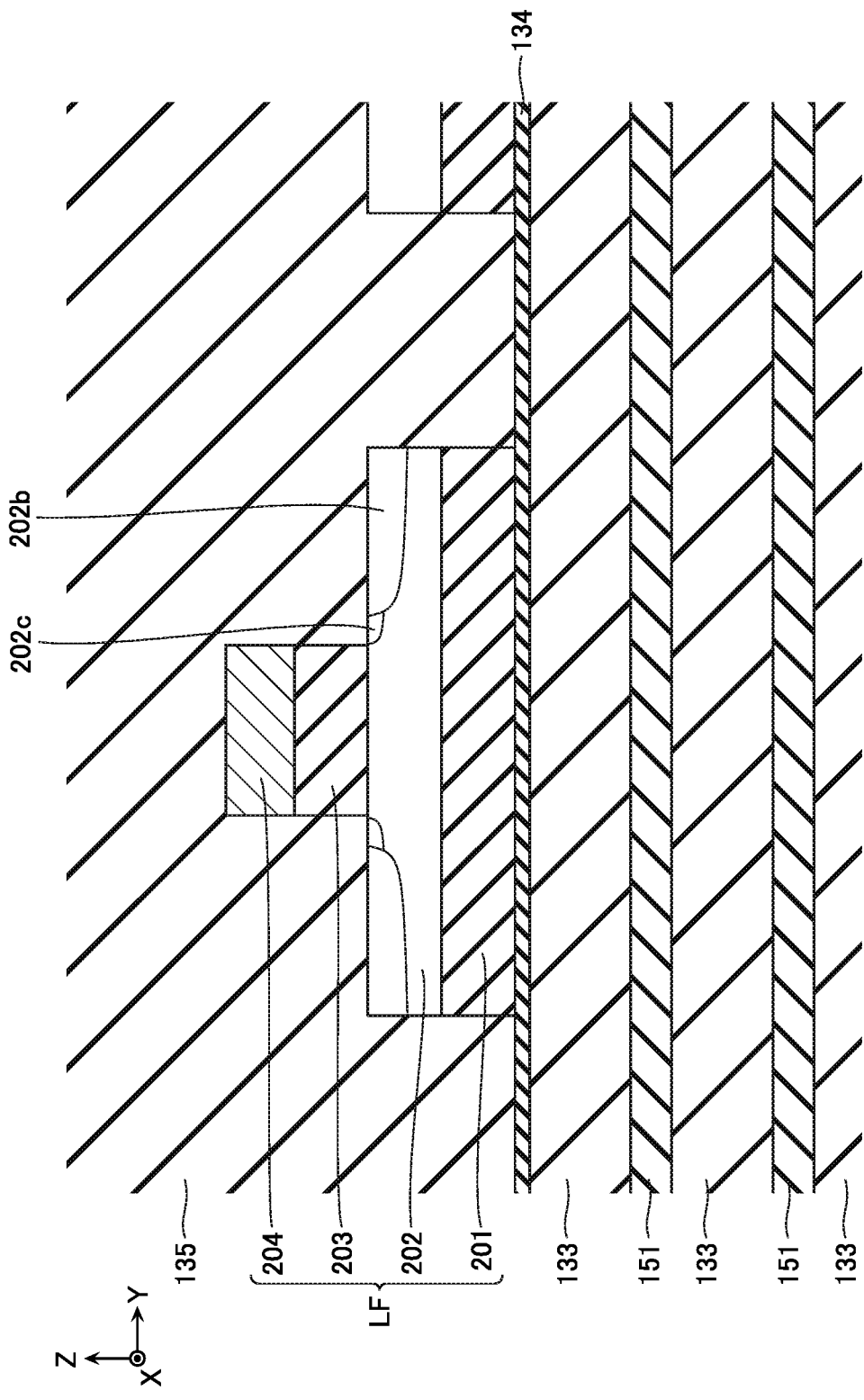
FIG. 22 is a schematic cross-sectional view showing the method of manufacturing the semiconductor memory device.

Subsequently, as shown in FIGS. 21 and 22, the insulating layer 135 is formed on the resultant structure. This step is performed by means of, for example, CVD or the like.

Figure 23:
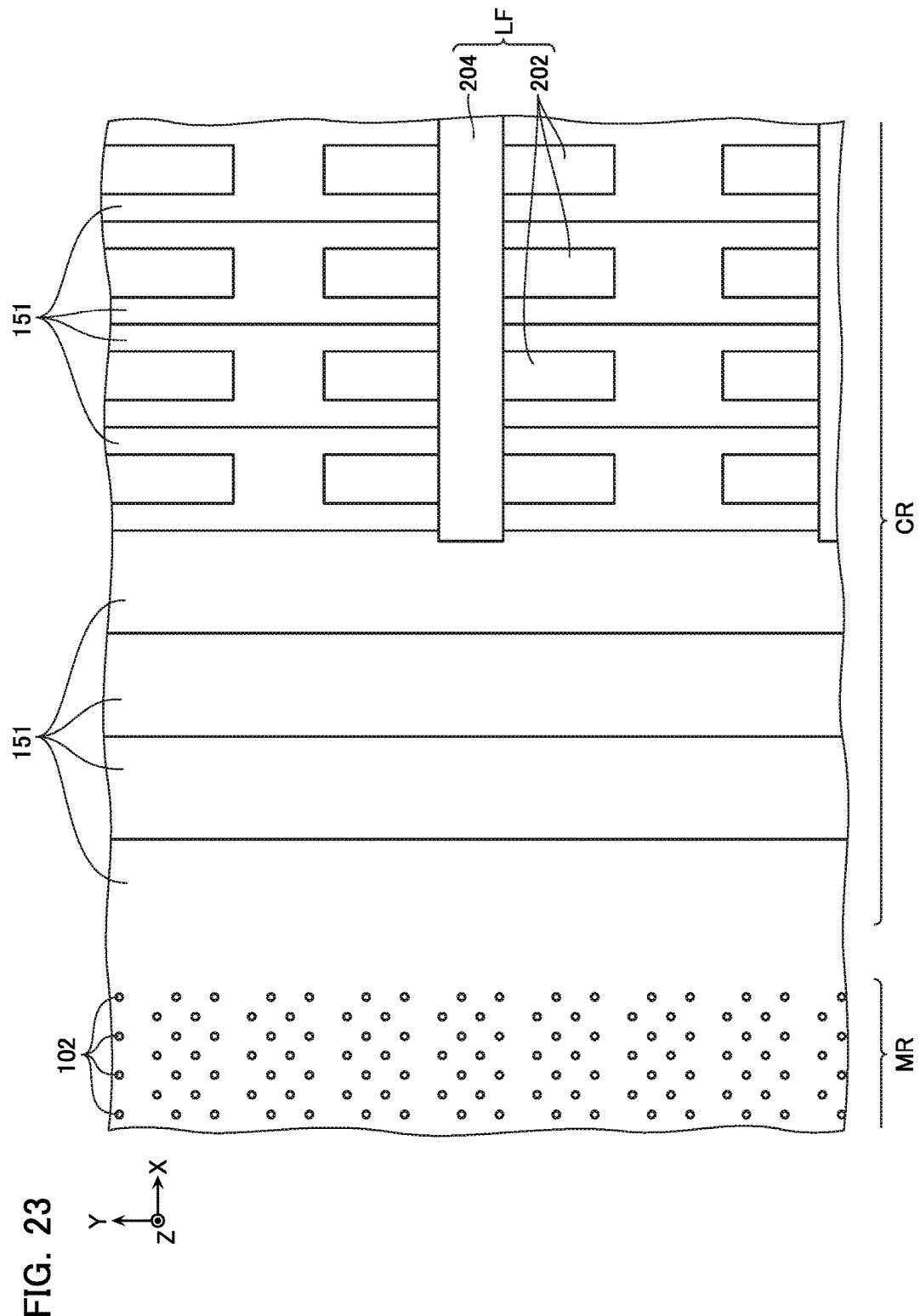
FIG. 23 is a schematic plan view showing the method of manufacturing the semiconductor memory device.

Subsequently, as shown in FIG. 23, the first semiconductor layer 102 or the like is formed in the memory region MR. In this step, a memory hole is formed by means of, for example, RIE or the like, and the first gate insulating layer 104 (FIG. 3) and a semiconductor layer formed of amorphous silicon (a-Si) are deposited by means of, for example, CVD or the like in the memory hole. The resultant structure is subjected to annealing or the like to reform the crystal structure of the semiconductor layer to polycrystalline silicon (p-Si), and thereby to form the first semiconductor layer 102.

Figure 24:
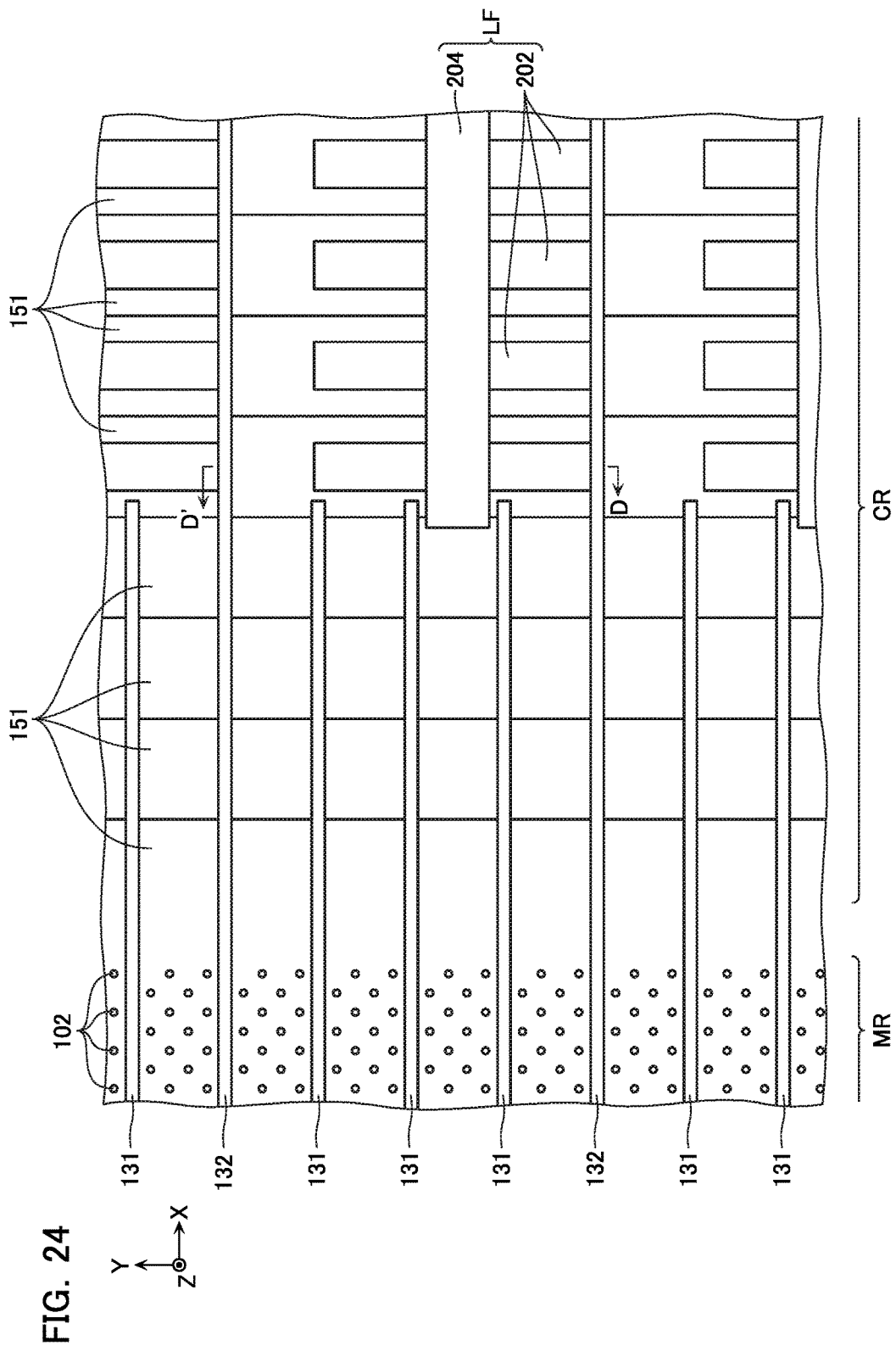
FIG. 24 is a schematic plan view showing the method of manufacturing the semiconductor memory device according to the first embodiment.
Figure 25:
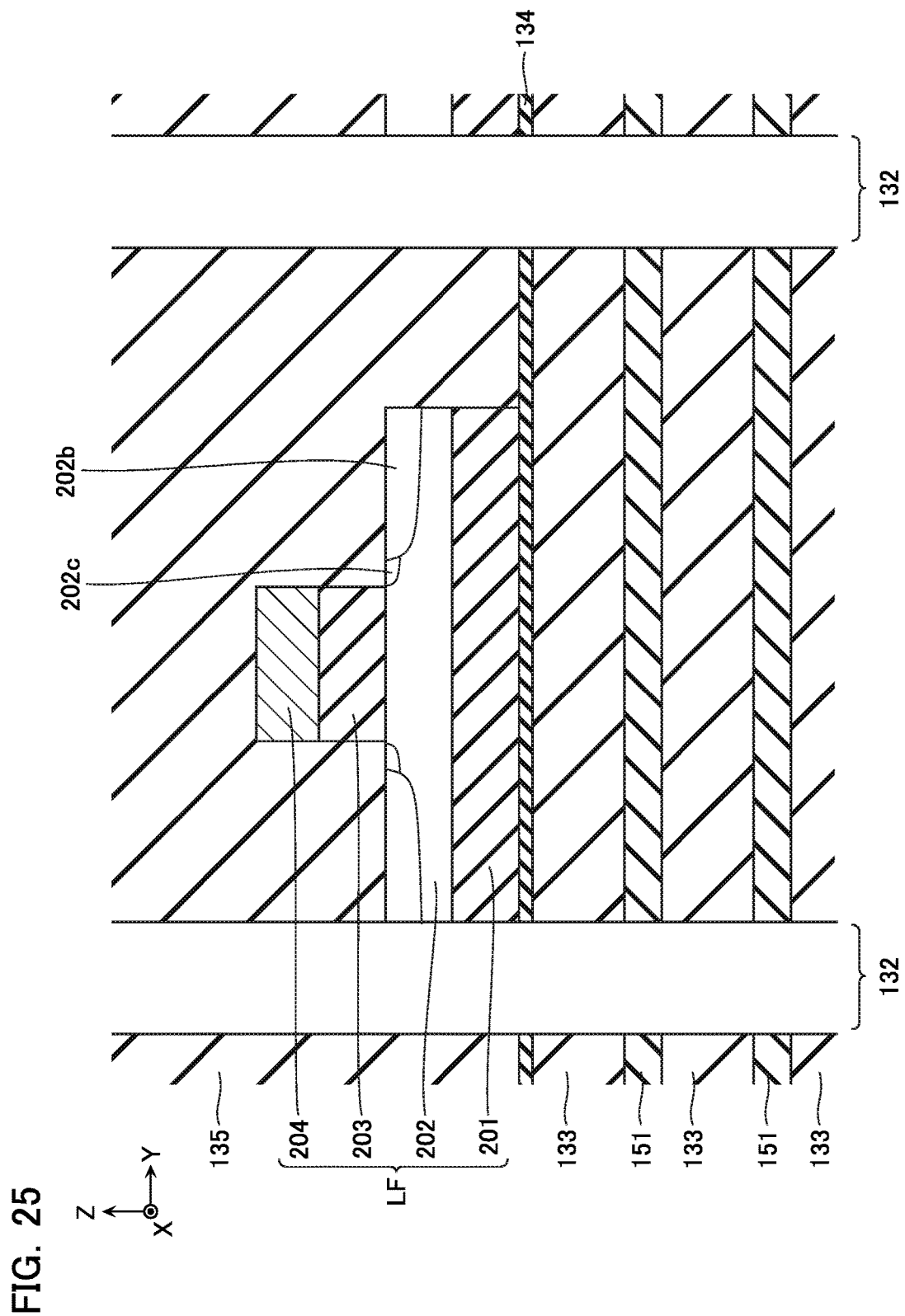
FIG. 25 is a schematic cross-sectional view showing the method of manufacturing the semiconductor memory device.

Subsequently, as shown in FIGS. 24 and 25, the first slits 131 and the second slits 132 are formed. This step is performed by means of, for example, RIE or the like.

Figure 26:
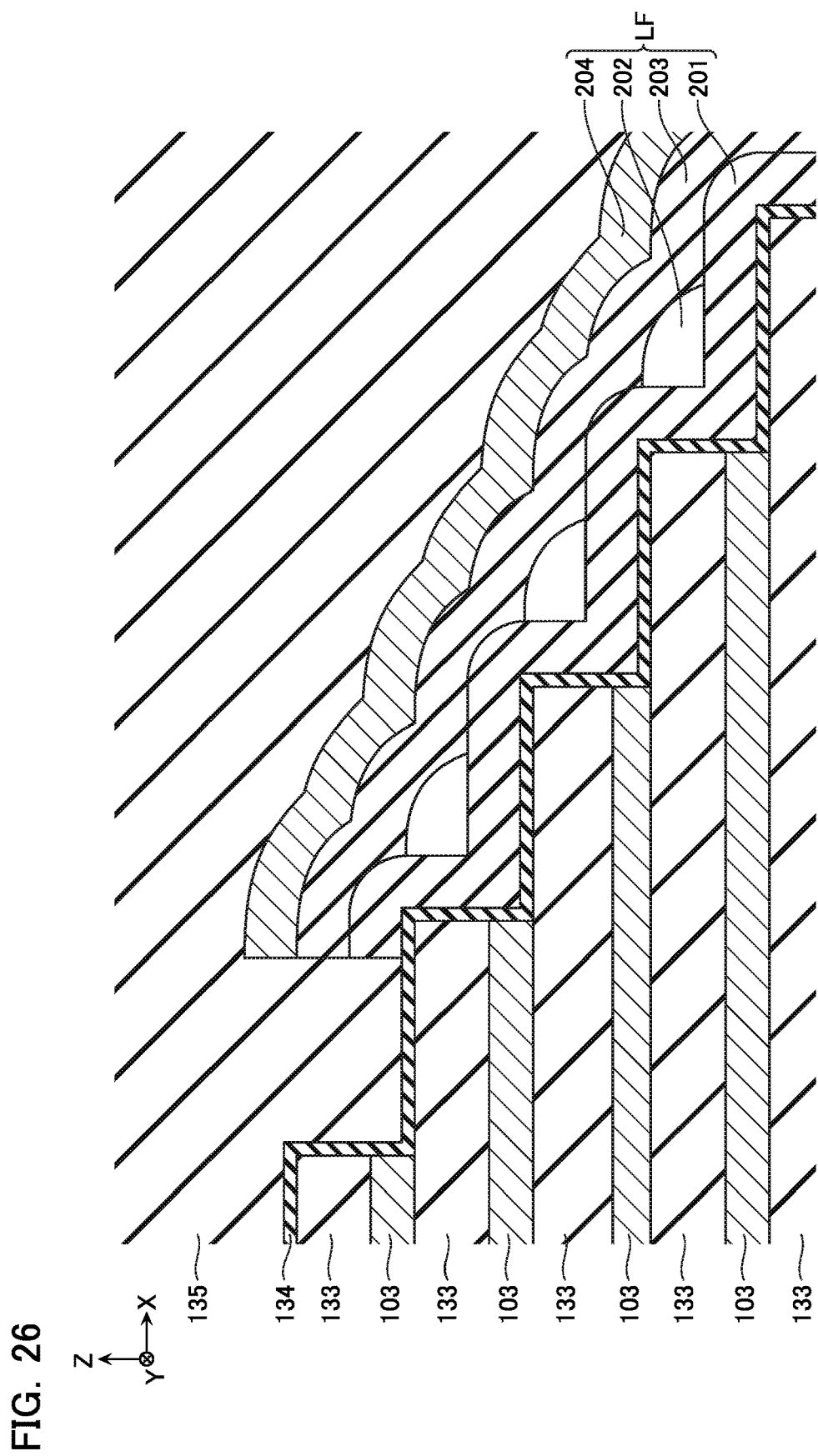
FIG. 26 is a schematic cross-sectional view showing the method of manufacturing the semiconductor memory device.
Figure 27:
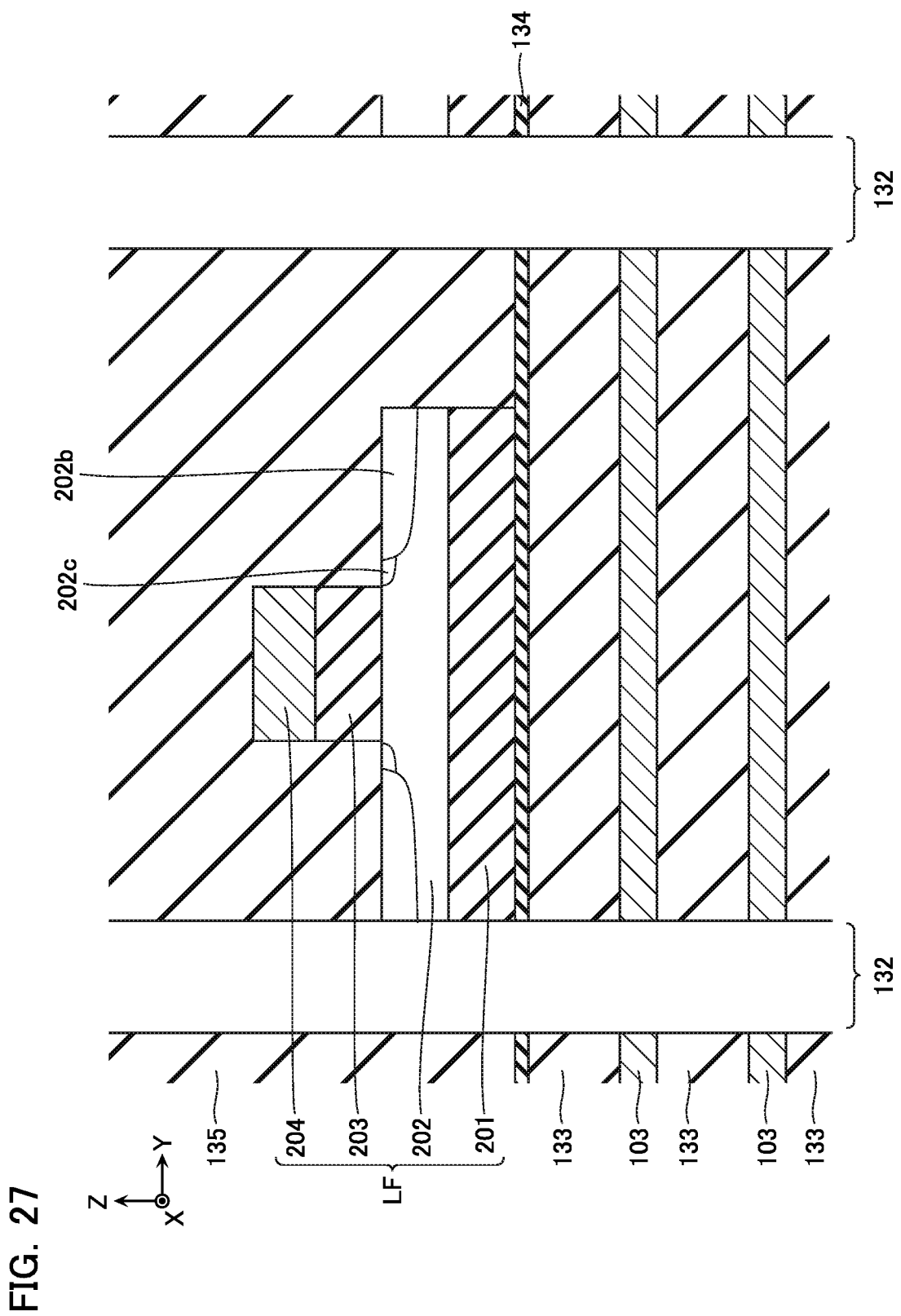
FIG. 27 is a schematic cross-sectional view showing the method of manufacturing the semiconductor memory device.

Subsequently, as shown in FIGS. 26 and 27, the first gate electrodes 103 are formed. In this step, for example, the sacrifice layers 151 are subjected to wet etching using phosphoric acid through the first slits 131 and the second slits 132 to selectively remove it. Then, titanium nitride (TiN) and tungsten (W) or the like are deposited on the upper surface, lower surface and side surfaces intersecting the Y direction of the second insulating layer 133 through the first slits 131 and the second slits 132. Next, the resultant structure is subjected to wet etching or the like to remove the portions of the deposited film covering the side surfaces intersecting the Y direction of the second insulating layer 133.

Figure 28:
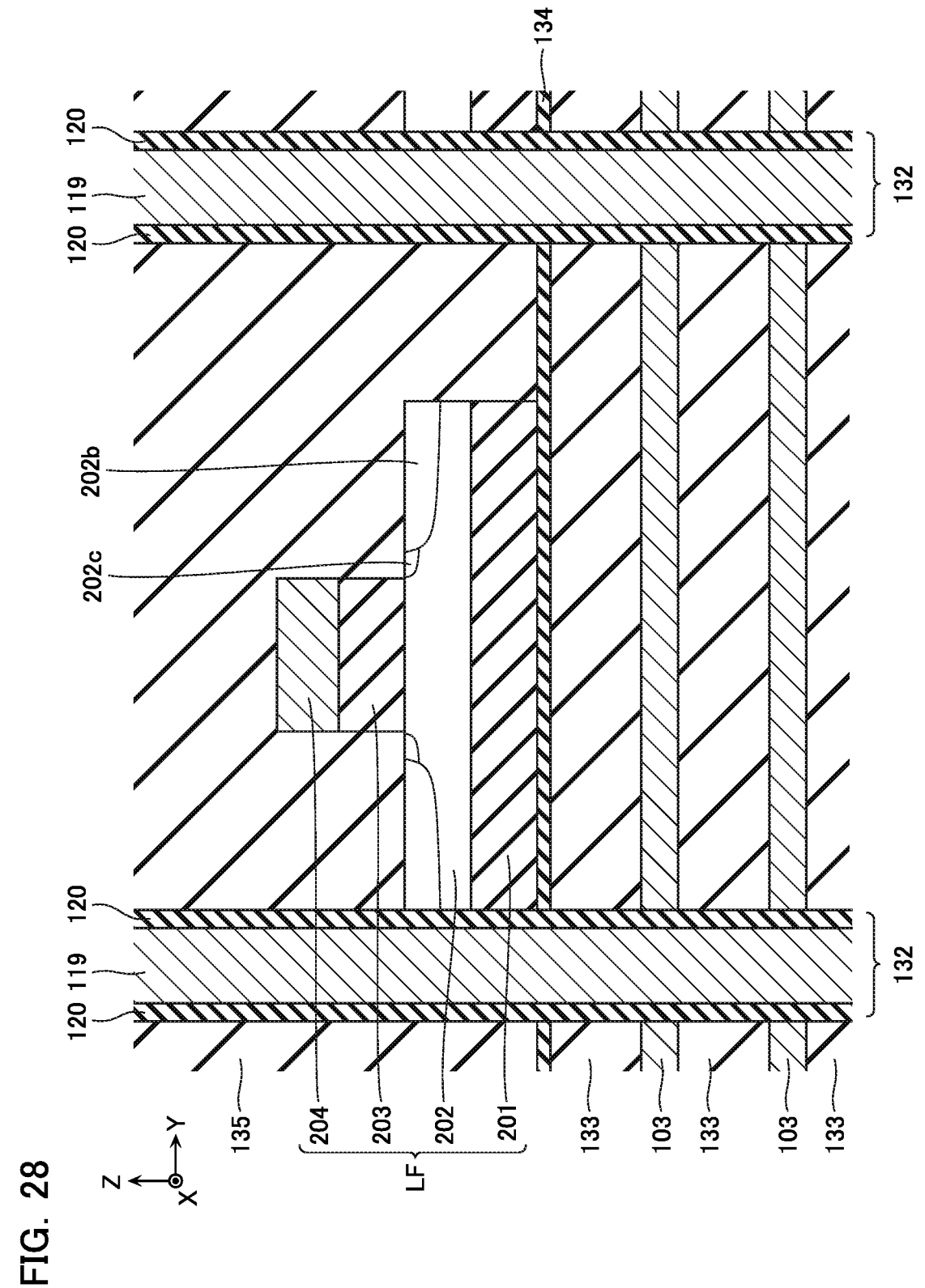
FIG. 28 is a schematic cross-sectional view showing the method of manufacturing the semiconductor memory device.

Subsequently, as shown in FIG. 28, an insulating layer 120 and the contacts 119 are deposited in the first slits 131 and the second slits 132. Then, contacts, wirings and the like are formed to manufacture the semiconductor memory device according to the first embodiment.

Advantageous Effect

As described above with reference to FIG. 3, the semiconductor memory device according to the first embodiment includes the laminated film LF covering at least parts of the upper surfaces and at least parts of the side surfaces intersecting the X direction of the plurality of the first gate electrodes 103. Additionally, this laminated film LF includes the first insulating layer 201 laminated on the contact portion CP, the plurality of the second semiconductor layers 202 provided on the first insulating layer 201, the second gate insulating layer 203 provided on the plurality of the second semiconductor layers 202, and the second gate electrode 204 provided on the second gate insulating layer 203. Moreover, the positions of the plurality of the second semiconductor layers 202 are different from each other in the Z direction and the X direction.

In this configuration, since a plurality of field effect transistors are arranged above the contact portion CP, it is possible to reduce the number of transistors in the peripheral circuit 13 (FIG. 1) and the area of the peripheral circuit 13.

Furthermore, according to this configuration, it is easy to control the thickness of the first insulating layer 201. Accordingly, dielectric breakdown between the first gate electrode 103 and the second semiconductor layer 202 can be easily suppressed.

Moreover, as described above with reference to FIGS. 11, 14 and so on, this configuration can be realized by forming the semiconductor layer 202d on the stepped structure corresponding to the contact portion CP, and dividing the semiconductor layer 202d in self-alignment manner in the Z direction and the X direction utilizing the stepped shape of the semiconductor layer 202d. Accordingly, it is possible to manufacture the configuration without accurate patterning on the stepped structure having a height difference.

Furthermore, as described above with reference to FIGS. 11, 14 and so on, it is possible to divide the semiconductor layer 202d after forming the semiconductor layer formed of amorphous silicon on the stepped structure corresponding to the contact portion CP and recovering the crystal structure to polycrystalline by means of annealing or the like. Therefore, by performing the annealing treatment in the condition of large thickness, it is possible to enlarge crystal grains in the semiconductor layer to form a transistor having excellent ON-OFF characteristics.

Second Embodiment

There will be described a semiconductor memory device according to a second embodiment with reference to FIGS. 29 and 30. The semiconductor memory device according to the second embodiment is basically configured similarly to the semiconductor memory device according to the first embodiment except portions described below. Note that in the description below, portions similar to those of the first embodiment will be assigned with identical symbols to those assigned in the first embodiment, and descriptions thereof will be omitted.

Figure 29:
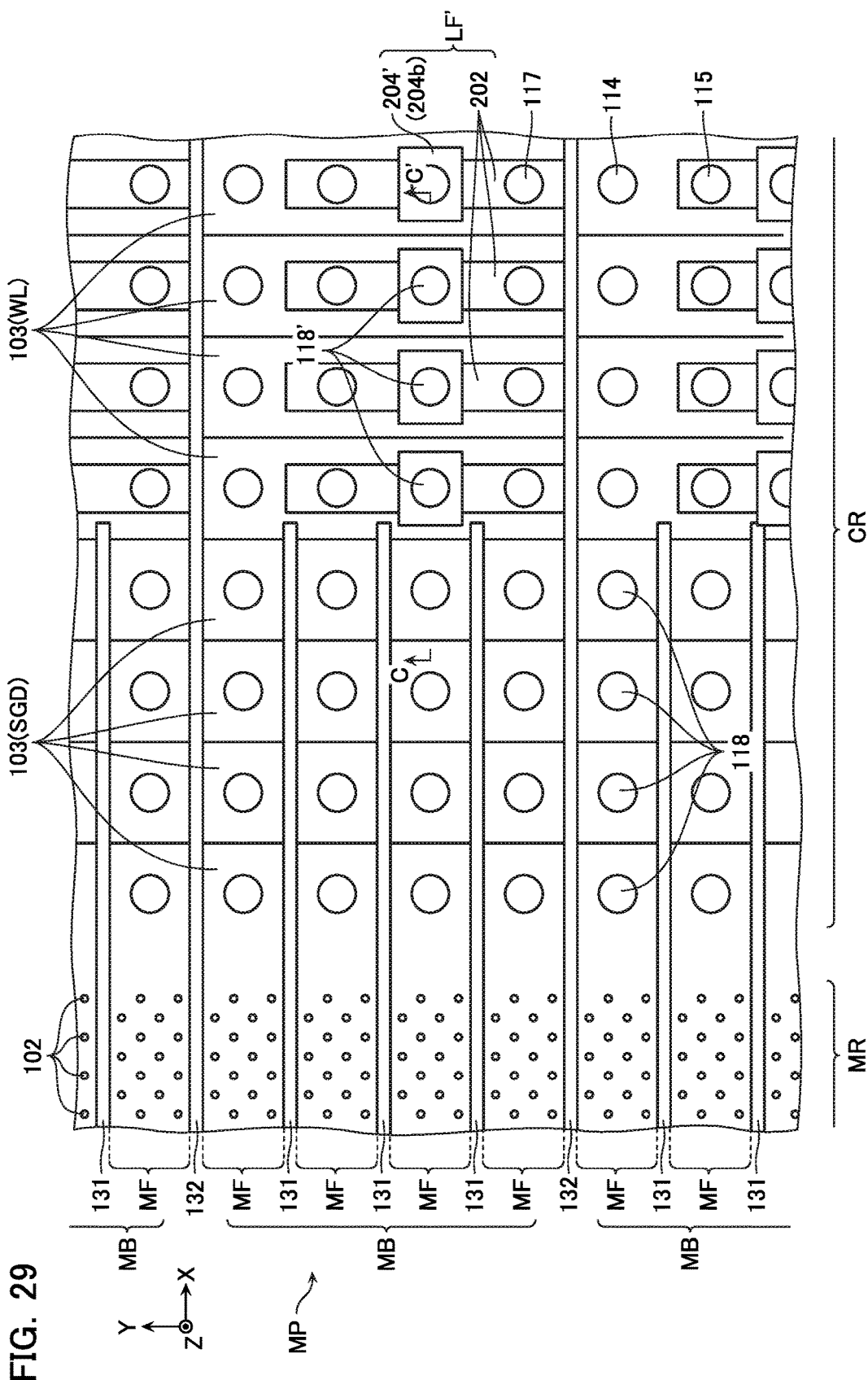
FIG. 29 is a schematic plan view showing a semiconductor memory device according to a second embodiment.
Figure 30:
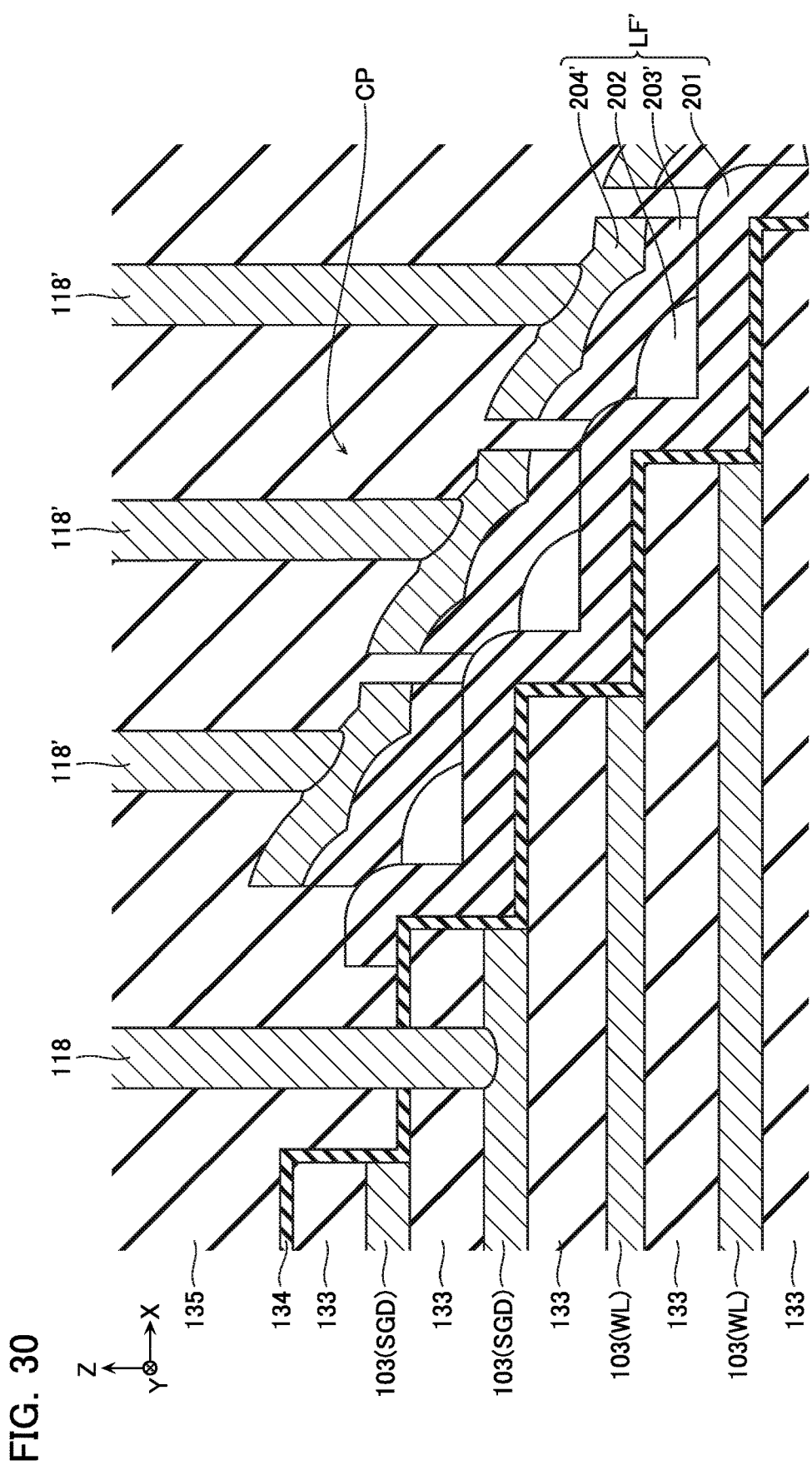
FIG. 30 is a cross-sectional view taken along line C-C' of the configuration shown in FIG. 29.

FIGS. 29 and 30 are a plan view and a cross-sectional view showing the configuration of the semiconductor memory device according to the second embodiment, respectively, and correspond to the portions shown in FIGS. 5 and 6 according to the first embodiment. In FIG. 29, part of the configuration is omitted.

In the semiconductor memory device according to the second embodiment, a second gate electrode 204' is divided in the X direction. In other words, the second gate electrode 204' includes a plurality of electrode portions 204b arranged in the X direction and spaced from each other in the X direction. These electrode portions 204b are arranged corresponding to the plurality of the second semiconductor layers 202 and face the upper surfaces of the second semiconductor layers. Moreover, contacts 118' are connected to these electrode portions 204b, respectively. In the second embodiment, not only the second gate electrode 204', but also a first gate insulating layer 203' is divided in the X direction.

In this configuration, since the second gate electrode 204' includes the plurality of the electrode portions 204b spaced from each other, it is possible to control transistors in a laminated film LF' independently. Note that these transistors can be used in a device other than the block decoder BD (FIG. 2).

Third Embodiment

There will be described a semiconductor memory device according to a third embodiment with reference to FIGS. 31 and 32. The semiconductor memory device according to the third embodiment is basically configured similarly to the semiconductor memory device according to the first embodiment except portions described below. Note that in the description below, portions similar to those of the first embodiment will be assigned with identical symbols to those assigned in the first embodiment, and descriptions thereof will be omitted.

Figure 31:
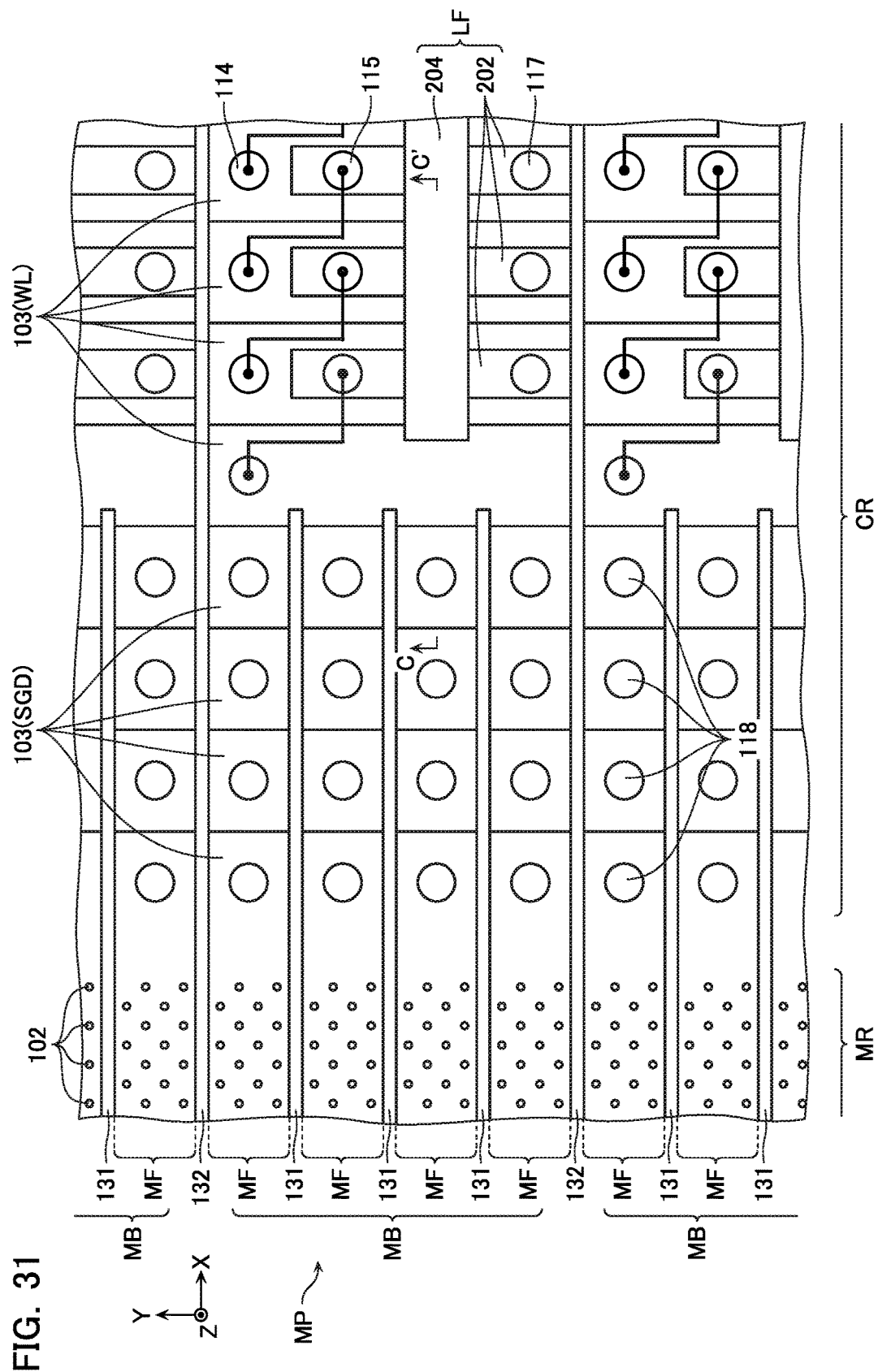
FIG. 31 is a schematic plan view showing a semiconductor memory device according to a third embodiment.
Figure 32:
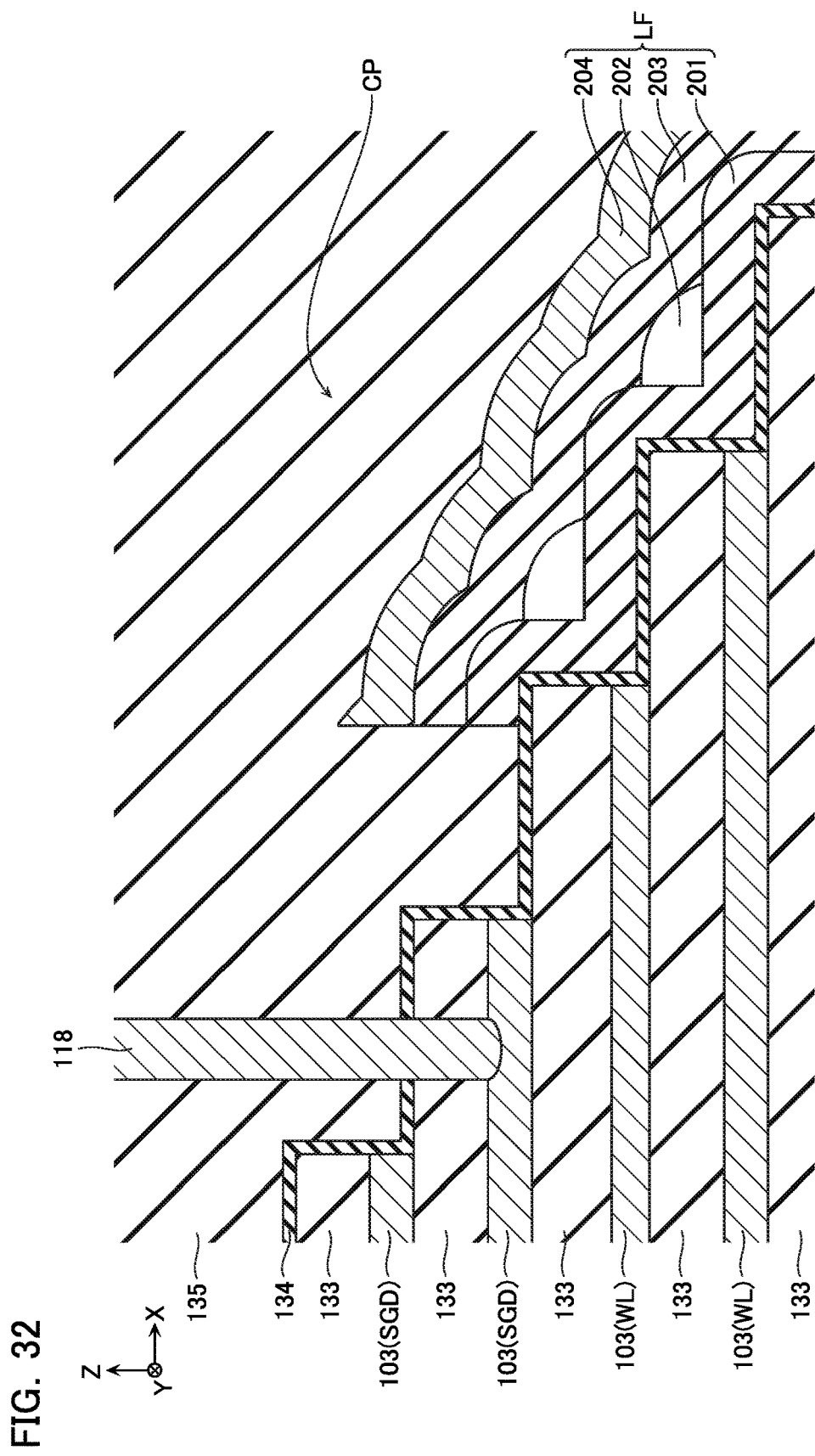
FIG. 32 is a cross-sectional view taken along line C-C' of the configuration shown in FIG. 31.

FIGS. 31 and 32 are a plan view and a sectional view showing the configuration of the semiconductor memory device according to the third embodiment, respectively, and correspond to the portions shown in FIGS. 5 and 6 according to the first embodiment. In FIG. 31, part of the configuration is omitted.

In the semiconductor memory device according to the third embodiment, the first contacts 114 are not connected to the second contacts 115 adjacent thereto in the Y direction, but to the second contact 115 corresponding to a first gate electrode 103 which is lower than the first gate electrode 103 connected to the first contact 114. Moreover, the second semiconductor layers 202 are not provided above upper most one among the first gate electrodes 103 corresponding to the word line WL.

In this configuration, it is possible to reduce the height of the laminated film LF (width from the upper surface of the substrate 101 to the upper edge of the laminated film LF in the Z direction).

Fourth Embodiment

There will be described a semiconductor memory device according to a fourth embodiment with reference to FIG. 33. The semiconductor memory device according to the fourth embodiment is basically configured similarly to the semiconductor memory device according to the first embodiment except portions described below. Note that in the description below, portions similar to those of the first embodiment will be assigned with identical symbols to those assigned in the first embodiment, and descriptions thereof will be omitted.

Figure 33:
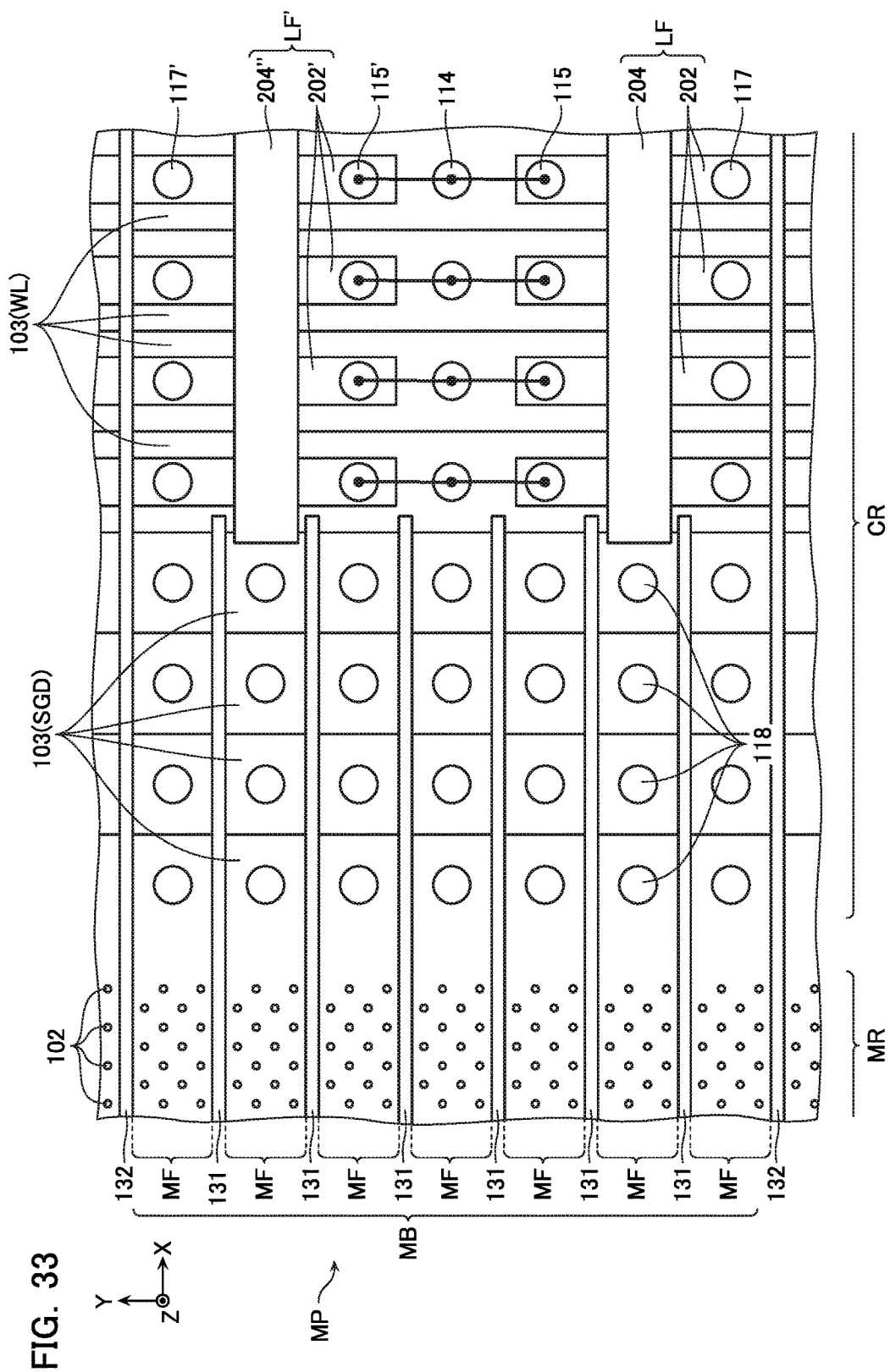
FIG. 33 is a schematic plan view showing a semiconductor memory device according to a fourth embodiment.

FIG. 33 is a plan view showing the configuration of the semiconductor memory device according to the fourth embodiment, and corresponds to the portion shown in FIG. 5 according to the first embodiment. In FIG. 33, part of the configuration is omitted.

In the semiconductor memory device according to the fourth embodiment, in addition to the laminated film LF, a laminated film LF' is for one memory block MB. The laminated film LF' includes third semiconductor layers 202' provided apart from the second semiconductor layers 202 in the Y direction and a third gate electrode 204" facing the third semiconductor layer 202'. Moreover, the semiconductor memory device according to the fourth embodiment includes fourth contacts 115' and fifth contacts 117'. The first contact 114 is provided between the second semiconductor layer 202 and the third semiconductor layer 202' in the Y direction. The third gate electrode 204" is provided between the first contact 114 and the fifth contact 117' in the Y direction. The fourth contact 115' is provided between the third gate electrode 204" and the first contact 114 in the Y direction. The fourth contact 115' is connected to a part of the third semiconductor layer 202'. The fifth contact 117' is connected to another part of the third semiconductor layer 202'.

Furthermore, the first contact 114 is connected to the second contact 115 adjacent thereto in the Y direction and the fourth contact 115' adjacent thereto in the Y direction in the fourth embodiment.

Here, if a particle size of polycrystalline silicon is small and the width of the channel is large in a thin film transistor using polycrystalline silicon as a channel area, sometimes a leak current generates in the grain boundary of crystals, resulting in deterioration of ON-OFF characteristics.

In the semiconductor memory device according to the fourth embodiment, it is possible to use the second semiconductor layer 202 and the third semiconductor layer 202' as a channel area of one transistor. Accordingly, it is possible to reduce the widths of the second semiconductor layer 202 and the third semiconductor layer 202' in the X direction, and decrease the leak current in an OFF-state while a current in an ON-state is secured.

Fifth Embodiment

There will be described a semiconductor memory device according to a fifth embodiment with reference to FIG. 34. The semiconductor memory device according to the fifth embodiment is basically configured similarly to the semiconductor memory device according to the fourth embodiment except portions described below. Note that in the description below, portions similar to those of the fourth embodiment will be assigned with identical symbols to those assigned in the fourth embodiment, and descriptions thereof will be omitted.

Figure 34:
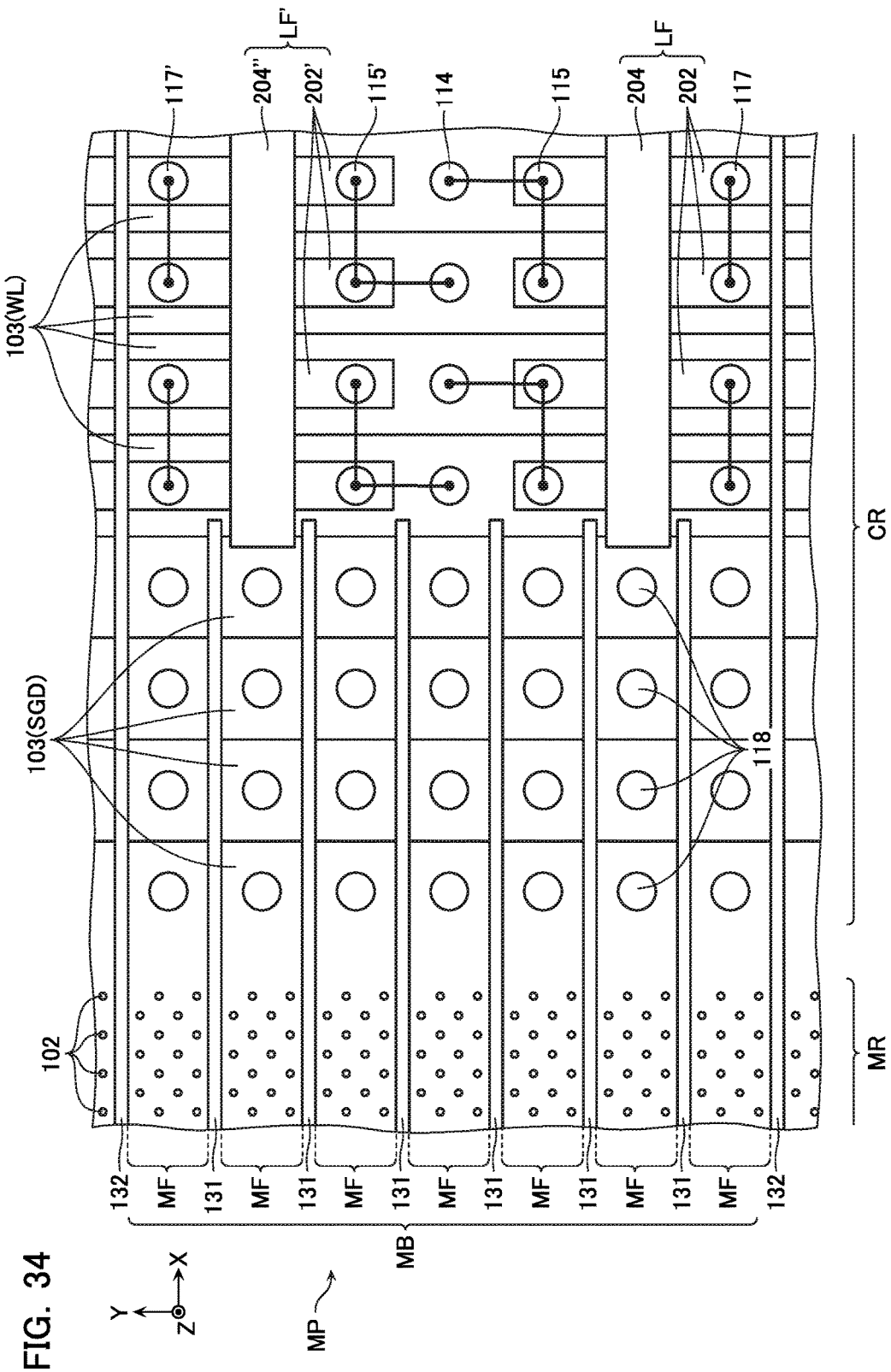
FIG. 34 is a schematic plan view showing a semiconductor memory device according to a fifth embodiment.

FIG. 34 is a plan view showing the configuration of the semiconductor memory device according to the fifth embodiment, and corresponds to the portion shown in FIG. 33 according to the fourth embodiment. In FIG. 34, part of the configuration is omitted.

In the semiconductor memory device according to the fifth embodiment, a certain second contact 115 is connected to the first contact 114 adjacent thereto in the Y direction and another second contact 115 adjacent thereto in the X direction in the semiconductor memory device according to the fifth embodiment. Additionally, two third contacts 117 corresponding to these second contacts 115 are connected to each other and to the peripheral circuit 13 (FIG. 1). Furthermore, a certain fourth contact 115' is connected to the first contact 114 adjacent thereto in the Y direction and another fourth contact 115' adjacent thereto in the X direction. Additionally, two fifth contacts 117' corresponding to these fourth contacts 115' are connected to each other and to the peripheral circuit 13 (FIG. 1).

The semiconductor memory device according to the fifth embodiment can also exhibits the same effects as the fourth embodiment.

Other Embodiments

In the first to fifth embodiments, semiconductor memory devices using flash memory are exemplified. However, as described above, there are semiconductor memory devices in which memory cells are disposed three-dimensionally and having various structures. In some of these structures, a stepped contact portion is provided in order to connect wirings connected with memory cells to contacts. The present invention can be applied to the semiconductor memory devices provided with such a contact portion.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a first semiconductor layer provided above a substrate and extending in a first direction intersecting an upper surface of the substrate;
a plurality of first gate electrodes arranged in the first direction, extending in a second direction intersecting the first direction, facing the first semiconductor layer in the second direction, and having end portions in the second direction, positions of the end portions in the second direction being different from each other, the end portions forming a stepped contact portion;
a first gate insulating layer provided between the first semiconductor layer and the first gate electrodes and including a memory portion; and
a laminated film covering at least parts of upper surfaces of the first gate electrodes and at least parts of side surfaces intersecting the second direction of the first gate electrodes,
the laminated film including:
a first insulating layer laminated on the contact portion;
a plurality of second semiconductor layers provided on the first insulating layer;
a second gate insulating layer provided on the plurality of the second semiconductor layers; and
a second gate electrode provided on the second gate insulating layer,
positions of the plurality of the second semiconductor layers in the first direction being different from each other, and
positions of the plurality of the second semiconductor layers in the second direction being different from each other.

2. The semiconductor memory device according to claim 1, wherein the plurality of the second semiconductor layers are provided above the end portions of the first gate electrodes in the second direction via the first insulating layer.

3. The semiconductor memory device according to claim 1, wherein a thickness of the first insulating layer in the first direction is larger than that of a first gate electrode of the plurality of first gate electrodes in the first direction.

4. The semiconductor memory device according to claim 1, further comprising a second insulating layer provided between the plurality of the first gate electrodes arranged in the first direction,
the second insulating layer covering an upper surface of an end portion in the second direction of the first gate electrodes, and
the laminated film covering at least a part of an upper surface of the second insulating layer and a side surface intersecting the second direction of the second insulating layer.

5. The semiconductor memory device according to claim 1, wherein an upper surface of the second semiconductor layer and a side surface intersecting the second direction of the second semiconductor layer form an upward convex curved surface.

6. The semiconductor memory device according to claim 1, wherein the second gate electrode faces the plurality of the second semiconductor layers.

7. The semiconductor memory device according to claim 1, wherein the second gate electrode includes a plurality of electrode portions spaced from each other, and each of the electrode portions faces each of the second semiconductor layers corresponding thereto.

8. The semiconductor memory device according to claim 1, further comprising a first contact, a second contact and a third contact arranged in this order in a third direction intersecting the first direction and the second direction,
the second gate electrode being provided between the second contact and the third contact in the third direction,
the first contact being connected to the first gate electrodes,
the second contact being connected to a part of the second semiconductor layers, and
the third contact being connected to another part of the second semiconductor layers.

9. The semiconductor memory device according to claim 8, comprising a plurality of the first contacts and a plurality of the second contacts,
the plurality of the first contacts being arranged in the second direction and connected to the plurality of the first gate electrodes, respectively, and
the plurality of the second contacts being arranged in the second direction and being connected to the plurality of the second semiconductor layers, respectively.

10. The semiconductor memory device according to claim 8, wherein the first contact is connected to the second contact.

11. The semiconductor memory device according to claim 9, wherein the first contact is connected to the second contact corresponding to a first gate electrode of the plurality of first gate electrodes lower than another first gate electrode of the plurality of first gate electrodes connected to the first contact.

12. The semiconductor memory device according to claim 9, wherein at least one of the second contacts is connected to the first contact adjacent to one of the second contacts in the third direction and another of the second contacts adjacent to the one of the second contacts in the second direction.

13. The semiconductor memory device according to claim 8, further comprising:
- a third semiconductor layer provided apart from the second semiconductor layers in the third direction;
- a third gate electrode provided corresponding to the third semiconductor layer;
- a fourth contact; and
- a fifth contact,
- the first contact being provided between the second semiconductor layers and the third semiconductor layer in the third direction,
- the third gate electrode being provided between the first contact and the fifth contact in the third direction,
- the fourth contact being provided between the third gate electrode and the first contact in the third direction,
- the fourth contact being connected to a part of the third semiconductor layer,
- the fifth contact being connected to another part of the third semiconductor layer, and
- the first contact being connected to the second contact adjacent to the first contact in the third direction and the fourth contact adjacent to the first contact in the third direction.

* * * * *